United States Patent
McCarten et al.

(10) Patent No.: US 8,339,494 B1
(45) Date of Patent: Dec. 25, 2012

(54) IMAGE SENSOR WITH CONTROLLABLE VERTICALLY INTEGRATED PHOTODETECTORS

(75) Inventors: John P. McCarten, Penfield, NY (US); Robert Michael Guidash, Rochester, NY (US)

(73) Assignee: Truesense Imaging, Inc., Rochester, NY (US)

( * ) Notice: Subject to any disclaimer, the term of this patent is extended or adjusted under 35 U.S.C. 154(b) by 0 days.

(21) Appl. No.: 13/193,722

(22) Filed: Jul. 29, 2011

(51) Int. Cl.
*H04N 3/14* (2006.01)
*H01L 21/00* (2006.01)
*H01L 31/062* (2012.01)

(52) U.S. Cl. ........ 348/294; 348/311; 257/447; 257/448; 257/292

(58) Field of Classification Search .................. 348/294, 348/308, 311, 296, 297; 257/291, 292, 447, 257/448, 441, 443; 250/208.1
See application file for complete search history.

(56) References Cited

U.S. PATENT DOCUMENTS

| | | | |
|---|---|---|---|
| 5,965,875 A | 10/1999 | Merrill | |
| 5,986,297 A | 11/1999 | Guidash et al. | |
| 6,540,991 B2 | 4/2003 | Klassen et al. | |
| 6,632,701 B2 | 10/2003 | Merrill | |
| 7,385,166 B2 | 6/2008 | Fossum | |
| 7,858,915 B2 * | 12/2010 | McCarten et al. | 257/292 |
| 8,018,016 B2 * | 9/2011 | McCarten et al. | 257/447 |
| 8,076,746 B2 * | 12/2011 | McCarten et al. | 257/447 |
| 8,178,938 B2 * | 5/2012 | Guidash | 257/432 |
| 2008/0083939 A1 | 4/2008 | Guidash | |
| 2010/0109060 A1 * | 5/2010 | Mao et al. | 257/292 |
| 2010/0327388 A1 | 12/2010 | McCarten et al. | |

OTHER PUBLICATIONS

Lauxtermann et al., "Comparison of Global Shutter Pixels for CMOS Image Sensors", 2007 IEEE International Image Sensors Workshop Proceedings, Jun. 7, 2007.
Wang et al., "A 2.2M CMOS Image Sensor for High Speed Machine Vision Applications", SPIE-IS&T, vol. 7536, San Jose, Jan. 2010.

* cited by examiner

*Primary Examiner* — Nhan T Tran
(74) *Attorney, Agent, or Firm* — Bingham McCutchen LLP

(57) ABSTRACT

An image sensor includes front-side and backside photodetectors of a first conductivity type disposed in a substrate layer of the first conductivity type. A front-side pinning layer of a second conductivity type is connected to a first contact. The first contact receives a predetermined potential. A backside pinning layer of the second conductivity type is connected to a second contact. The second contact receives an adjustable and programmable potential.

5 Claims, 25 Drawing Sheets

IMAGE SENSOR WITH CONTROLLABLE VERTICALLY INTEGRATED PHOTODETECTORS

TECHNICAL FIELD

The present invention relates generally to image sensors for use in digital cameras and other types of image capture devices, and more particularly to image sensors having vertically integrated photodetectors in a single pixel.

BACKGROUND

An electronic image sensor captures images using light-sensitive photodetectors that convert incident light into electrical signals. Image sensors are generally classified as either front-side-illuminated image sensors or back-illuminated image sensors. As the image sensor industry migrates to smaller and smaller pixel designs to increase resolution and reduce costs, the benefits of back-illumination become clearer. In front-side-illuminated image sensors, the electrical control lines or conductors are positioned between the photodetectors and the light-receiving side of the image sensor. The consequence of this positioning is the electrical conductors block part of the light that should be received by the photodetectors, resulting in poor quantum efficiency (QE) performance, especially for small pixels. For back-illuminated image sensors, the electrical control lines or conductors are positioned opposite the light-receiving side of the sensor and do not reduce QE performance.

Back-illuminated image sensors therefore solve the QE performance challenge of small pixel designs. But small pixel designs still have two other performance issues. First, small pixel designs suffer from low photodetector (PD) charge capacity. This is because the first order charge capacity scales along with the area of the photodetector. Second, the process of fabricating a back-illuminated sensor consists of bonding a device wafer to an interposer wafer and then thinning the device wafer. This process produces grid distortions. These grid distortions lead to the misalignments of the color filter array, which increases the amount of pixel-to-pixel color crosstalk.

These shortcomings were addressed in United States Patent Application Publication 2010/0327388 entitled "Back-Illuminated Image Sensors Having Both Front-side and Backside Photodetectors". A cross-sectional diagram of one embodiment disclosed in this application is shown in FIG. 1. Front-side photodetectors 718$f$, 720$f$ and 722$f$ are disposed adjacent to the front-side surface 1100 and backside photodetectors 718$b$, 720$b$ and 722$b$ adjacent to the backside surface 1112 of the wafer. There are isolated pinning layers on both the front-side and backside surfaces of the wafer, 728 and 740 respectively, where the front-side and backside pinning layers are biased at different fixed potentials through contact 732 and 1104 respectively. FIG. 2 is graph of electrostatic potential along the line A-A shown in FIG. 1. A combined electrostatic photodetector potential 1200 is produced from the backside surface 1112 to the front-side surface 1100 that provides a small pixel with large charge capacity and low cross-talk. However some disadvantages can still exist with this structure compared to other image sensors such as interline CCD's and BSI sensors for infra-red imaging. These disadvantages can include poor electronic global shutter performance and poor infra-red QE.

A global electronic shutter (GES) operation is a desired feature for many applications that use both large and small pixels. In high speed machine vision applications, a global electronic shutter operation is desired to freeze motion of quickly moving objects. In digital photography applications, a global electronic shutter operation is desired for use with low light flash exposures and action photography. In order to maintain high image quality for global electronic shutter operation, a low dark current storage node is required. This low dark current storage node also needs to be isolated from the pixel sense node and well shielded from incident illumination in order to provide true Correlated Double Sampling (CDS) readout and accurate signal representation, respectively. Large pixel architectures have been disclosed that solve these problems to some degree, but require a large pixel area in order to implement multiple transistors and isolated storage nodes. Examples of these solutions are disclosed in U.S. Pat. No. 5,986,297, U.S. Pat. No. 6,540,991, U.S. Pat. No. 7,385,166, and in the articles entitled "Comparison of Global Shutter Pixels for CMOS Image Sensors" by S. Lauxtermann et al. and "A 2.2M CMOS Image Sensor for High Speed Machine vision Applications", proc SPIE vol 7536, San Jose, January 2010. These solutions cannot be effectively implemented in small pixels due to the additional components in each pixel.

Many applications such as aerospace, defense, surveillance and machine vision require imaging in the both the visible and infrared spectrums. It is further desirable in these applications to use a single sensor to reduce system cost and complexity. In consumer digital photography applications for small pixels, there is a need to further increase the sensitivity of an image sensor by using a single pixel to detect, separately store and readout specific spectral bands so that all incident photons are utilized at each pixel. Prior art color separation per pixel structures have been implemented, but still have deficiencies. The most relevant example is disclosed in U.S. Pat. No. 5,965,875 and U.S. Pat. No. 6,632,701. With this structure, each pixel can collect and separate photogenerated charge from multiple color illumination, for example red, green and blue. Therefore each pixel utilizes more of the visible spectrum and does not require the use of a bandpass filter per pixel. However, this structure requires multiple circuit elements in each pixel, cannot perform a global electronic shutter, and has variable color separation characteristics depending on the color temperature and brightness of the illuminants and the scene. These deficiencies can preclude the use of this structure in applications that require small low noise pixels with high quality color reproduction.

SUMMARY

A method for reading charge out of a pixel in an image sensor that includes multiple pixels. The pixel includes a front-side photodetector of a first conductivity type disposed in a substrate layer of the first conductivity type adjacent to a front-side of the substrate layer, a backside photodetector of the first conductivity type disposed in the substrate layer adjacent to a backside of the substrate layer, a front-side pinning layer of a second conductivity type spanning the front-side photodetector, a backside pinning layer of the second conductivity type spanning the backside photodetector, a front-side charge to voltage conversion region of the first conductivity type disposed in a front-side well of the second conductivity adjacent to the front-side photodetector, and a buried layer of the second conductivity type disposed in the substrate layer between the front-side and backside photodetectors. The buried layer is patterned with a gap in the buried layer that is aligned with the front-side and backside photodetectors such that a continuous region of the substrate layer extends from the front-side photodetector through the gap to the backside photodetector. The front-side pinning layer is set to a first potential and an electrostatic barrier is produced between the front-side photodetector and the backside photodetector by adjusting an adjustable and programmable second potential on the backside pinning layer to a second potential and adjusting an adjustable and programmable third potential on the buried layer to a third potential. An image is captured and photogenerated charge collected in the front-side photodetector and in the backside photodetector. The charge in the front-side photodetector is transferred to the charge to voltage conversion region. The electrostatic barrier between the backside photodetector and the front-side photodetector is removed and the charge in the backside photodetector is transferred to the front-side photodetector by adjusting the adjustable and programmable second and third potentials to different potentials. The charge in the front-side photodetector is then transferred to the charge to voltage conversion region.

ADVANTAGES

The present invention has the advantage of providing an image sensor with increased photodetector charge capacity and improved color crosstalk performance, high performance low noise global shutter, programmable mixed spectrum imaging, and higher sensitivity pixels via vertically integrated photodetectors for spectral separation. Further, these advantages are selectively implemented by different operating modes of the structure, which reduces cost and complexity of an imaging system.

BRIEF DESCRIPTION OF THE DRAWINGS

Embodiments of the invention are better understood with reference to the following drawings. The elements of the drawings are not necessarily to scale relative to each other.

DETAILED DESCRIPTION

Figure 1:
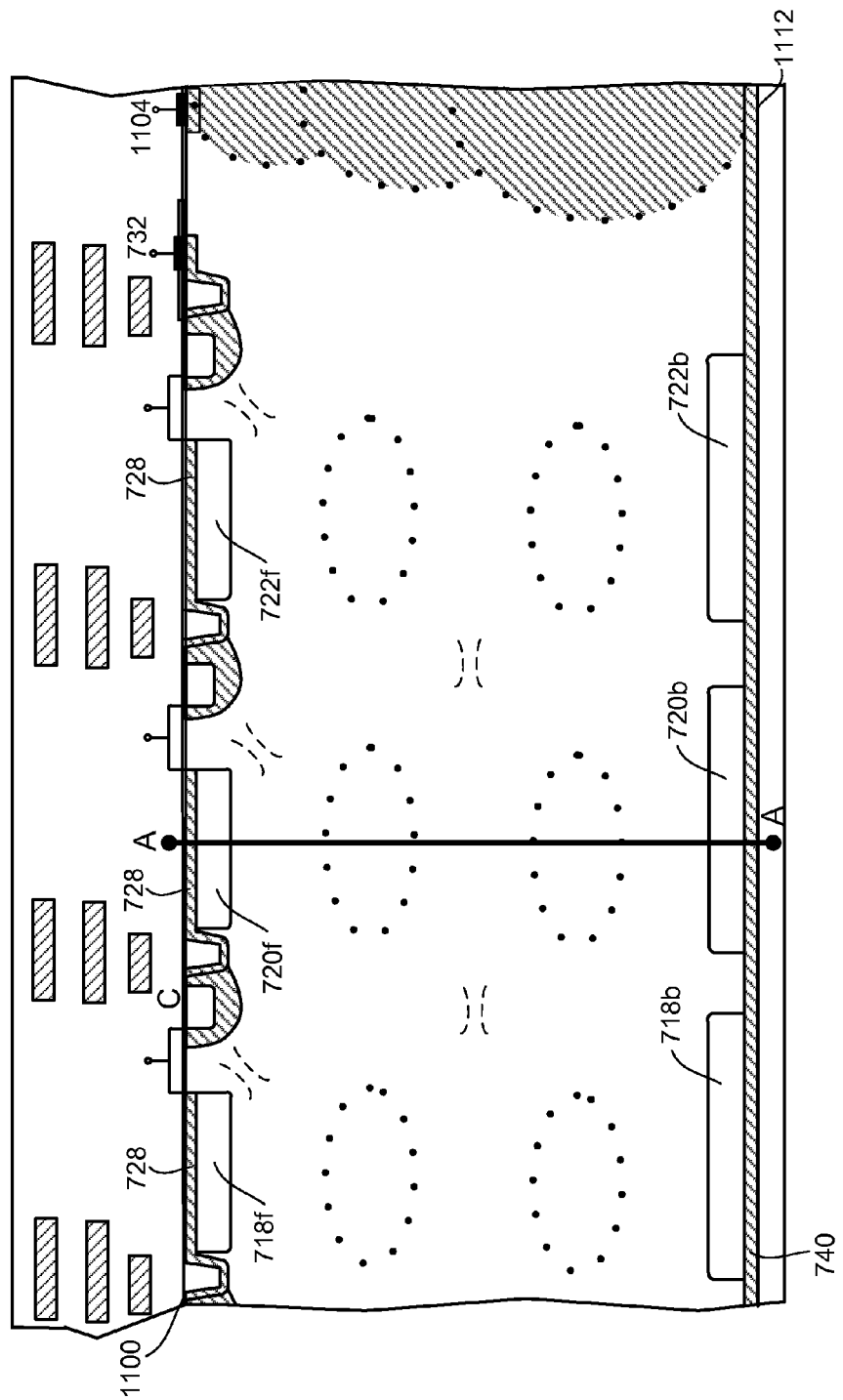
FIG. 1 is a cross-sectional view of a prior art image sensor.
Figure 2:
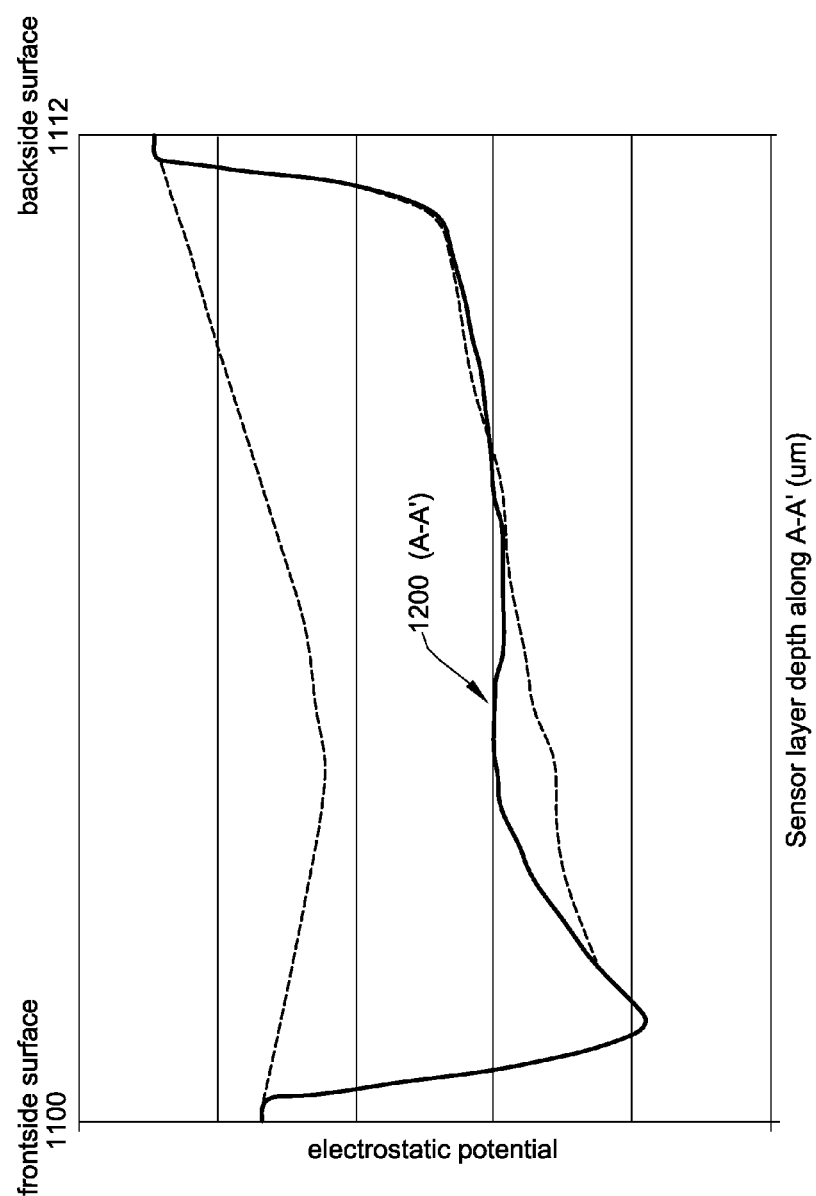
FIG. 2 is a graph of the electrostatic potential along line A-A shown in FIG. 1.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, charge, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the term "substrate layer" is to be understood as a semiconductor-based material including, but not limited to, silicon, silicon-on-insulator (SOI) technology, silicon-on-sapphire (SOS) technology, doped and undoped semiconductors, epitaxial layers or well regions formed on a semiconductor substrate, and other semiconductor structures.

Referring to the drawings, like numbers indicate like parts throughout the views.

Figure 3:
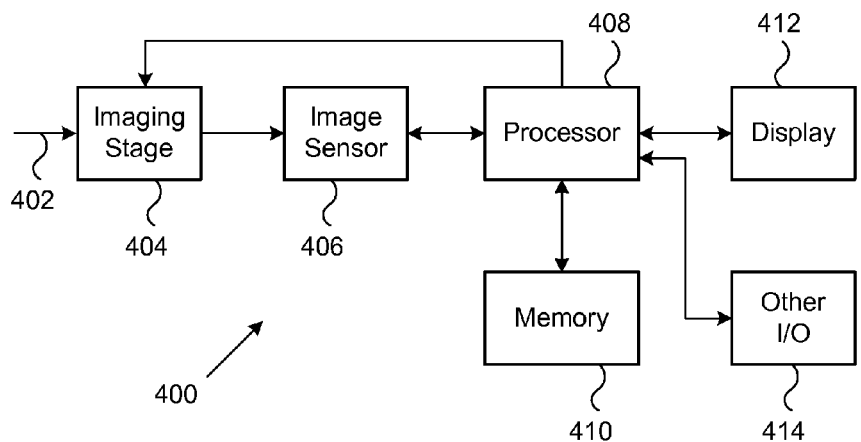
FIG. 3 is a simplified block diagram of an image capture device 400 in an embodiment in accordance with the invention.

FIG. 3 is a simplified block diagram of an image capture device in an embodiment in accordance with the invention. Image capture device 400 is implemented as a digital camera in FIG. 3. Those skilled in the art will recognize that a digital camera is only one example of an image capture device that can utilize an image sensor incorporating the present invention. Other types of image capture devices, such as, for example, cell phone cameras and digital video camcorders, can be used with the present invention.

In digital camera 400, light 402 from a subject scene is input to an imaging stage 404. Imaging stage 404 can include conventional elements such as a lens, a neutral density filter, an iris and a shutter. Light 402 is focused by imaging stage 404 to form an image on image sensor 406. Image sensor 406 captures one or more images by converting the incident light into electrical signals.

Digital camera 400 further includes processor 408, memory 410, display 412, and one or more additional input/output (I/O) elements 414. Although shown as separate elements in the embodiment of FIG. 3, imaging stage 404 may be integrated with image sensor 406, and possibly one or more additional elements of digital camera 400, to form a compact camera module.

Processor 408 may be implemented, for example, as a microprocessor, a central processing unit (CPU), an application-specific integrated circuit (ASIC), a digital signal processor (DSP), or other processing device, or combinations of multiple such devices. Various elements of imaging stage 404 and image sensor 406 may be controlled by timing signals or other signals supplied from processor 408.

Memory 410 may be configured as any type of memory, such as, for example, random access memory (RAM), read-only memory (ROM), Flash memory, disk-based memory, removable memory, or other types of storage elements, in any combination. A given image captured by image sensor 406 may be stored by processor 408 in memory 410 and presented on display 412. Display 412 is typically an active matrix color liquid crystal display (LCD), although other types of displays may be used. The additional I/O elements 414 may include, for example, various on-screen controls, buttons or other user interfaces, network interfaces, or memory card interfaces.

It is to be appreciated that the digital camera shown in FIG. 3 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 4:
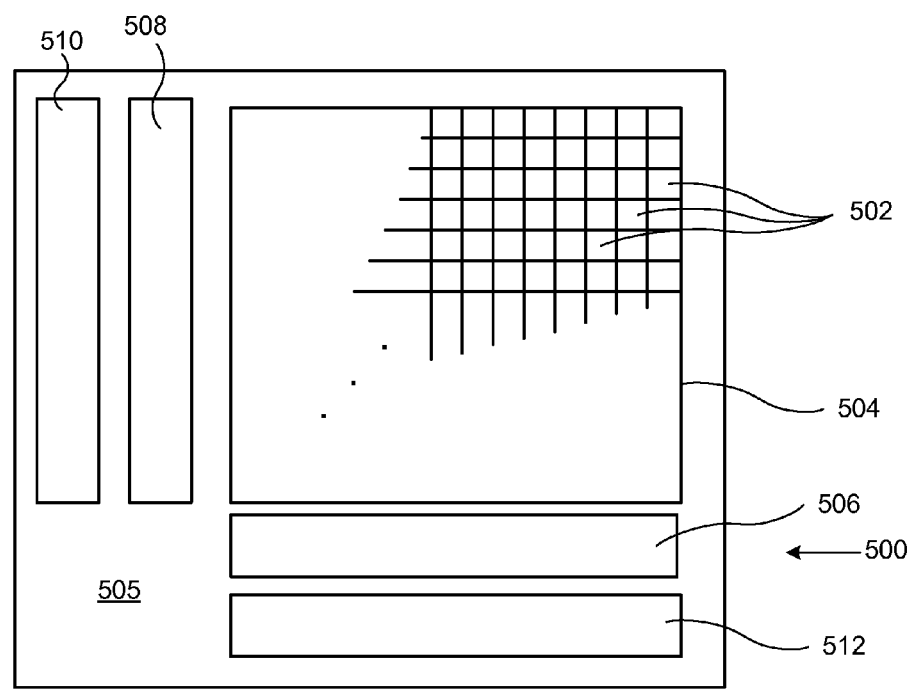
FIG. 4 is a simplified block diagram of image sensor 406 suitable for use as image sensor 406 shown in FIG. 3 in an embodiment in accordance with the invention.

Referring now to FIG. 4, there is shown a simplified block diagram of an image sensor suitable for use as image sensor 406 shown in FIG. 3 in an embodiment in accordance with the invention. Image sensor 500 typically includes pixels 502 that form a pixel array region 504. Image sensor 500 further includes column decoder and sample and hold circuits 506, row decoders and drivers 508, digital logic 510, and analog or digital output circuits 512 that are formed in a CMOS circuit region 505.

Image sensor 500 is implemented as a back or front-side-illuminated Complementary Metal Oxide Semiconductor (CMOS) image sensor in an embodiment in accordance with the invention. Thus, column decoder and sample and hold circuits 506, row decoders and drivers 508, digital logic 510, and analog or digital output circuits 512 are implemented as standard CMOS electronic circuits that are electrically connected to imaging area pixel array region 504.

Functionality associated with the sampling and readout of pixel array region 504 and the processing of corresponding image data may be implemented at least in part in the form of software that is stored in memory 410 and executed by processor 408 (see FIG. 3). Portions of the sampling and readout circuitry may be arranged external to image sensor 500, or formed integrally with pixel array region 504, for example, on a common integrated circuit with photodetectors and other elements of the pixel array region. Those skilled in the art will recognize that other peripheral circuitry configurations or architectures can be implemented in other embodiments in accordance with the invention.

Figure 5:
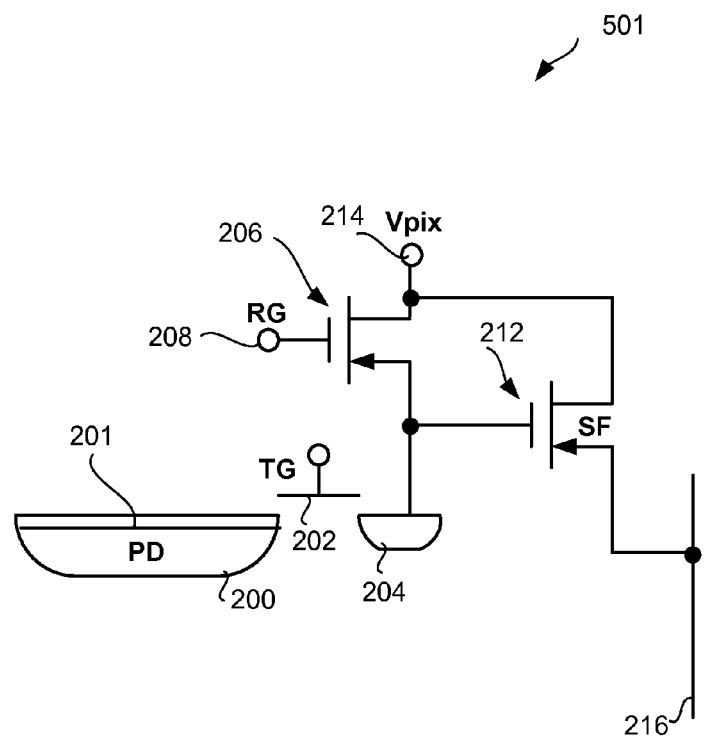
FIG. 5 is a schematic diagram of one example of a pixel suitable for use as pixel 502 shown in FIG. 4 in an embodiment in accordance with the invention.

FIG. 5 is a schematic diagram illustrating one example of a pixel suitable for use as pixel 502 shown in FIG. 4. The components included in pixel 501 are disposed adjacent to the front-side of an image sensor in an embodiment in accordance with the invention. Pixel 501 is a non-shared pixel that includes photodetector (PD) 200, pinning layer 201, transfer gate (TG) 202, charge-to-voltage conversion region 204, reset transistor 206 with a reset gate (RG) 208, and amplifier transistor (SF) 212, whose source is connected to output line 216. The drains of reset transistor 206 and amplifier transistor 212 are connected to a pixel supply voltage 214 Vpix. The source of reset transistor 206 and the gate of amplifier transistor 212 are connected to charge-to-voltage conversion mechanism 204.

Photodetector 200 is configured as a pinned photodiode, charge-to-voltage conversion mechanism 204 as a floating diffusion, and amplifier transistor 212 as a source follower transistor in an embodiment in accordance with the invention. Pixel 501 can be implemented with additional or different components in other embodiments in accordance with the invention. By way of example only, the reset transistor 206 and amplifier transistor 212 can be shared by multiple photodetectors and transfer gates.

Transfer gate 202 is used to transfer collected photo-generated charges from the photodetector 200 to charge-to-voltage conversion mechanism 204. Charge-to-voltage conversion mechanism 204 is used to convert the photo-generated charge into a voltage signal. Amplifier transistor 212 buffers the voltage signal stored in charge-to-voltage conversion mechanism 204 and amplifies and transmits the voltage signal to output line 216. Reset transistor 206 with reset gate 208 is used to reset charge-to-voltage conversion mechanism 204 to a known potential prior to readout. Output line 216 is connected to readout and image processing circuitry (not shown). As shown, the embodiment in FIG. 5 does not include a row select transistor. Voltage Vpix 214 is temporally varied and is supplied to the reset transistor and source follower transistor to provide selection and de-selection of pixels as is known in the art.

Embodiments in accordance with the invention are not limited to the pixel schematic shown in FIG. 5. Other pixel configurations can be used in other embodiments in accordance with the invention. By way of example only, a front-side pixel structure that shares one or more components between multiple pixels can be used in an embodiment in accordance with the invention. As another example, the transfer gate could be removed to provide a three transistor equivalent pixel. By way of example only a front-side pixel structure that includes stacked wafer architectures where the front-side pixel components are distributed on two wafers can be used in an embodiment in accordance with the invention. One such example is disclosed in U.S. Pat. No. 7,858,915 and United States Patent Application publication 2008/0083939.

Figure 6:
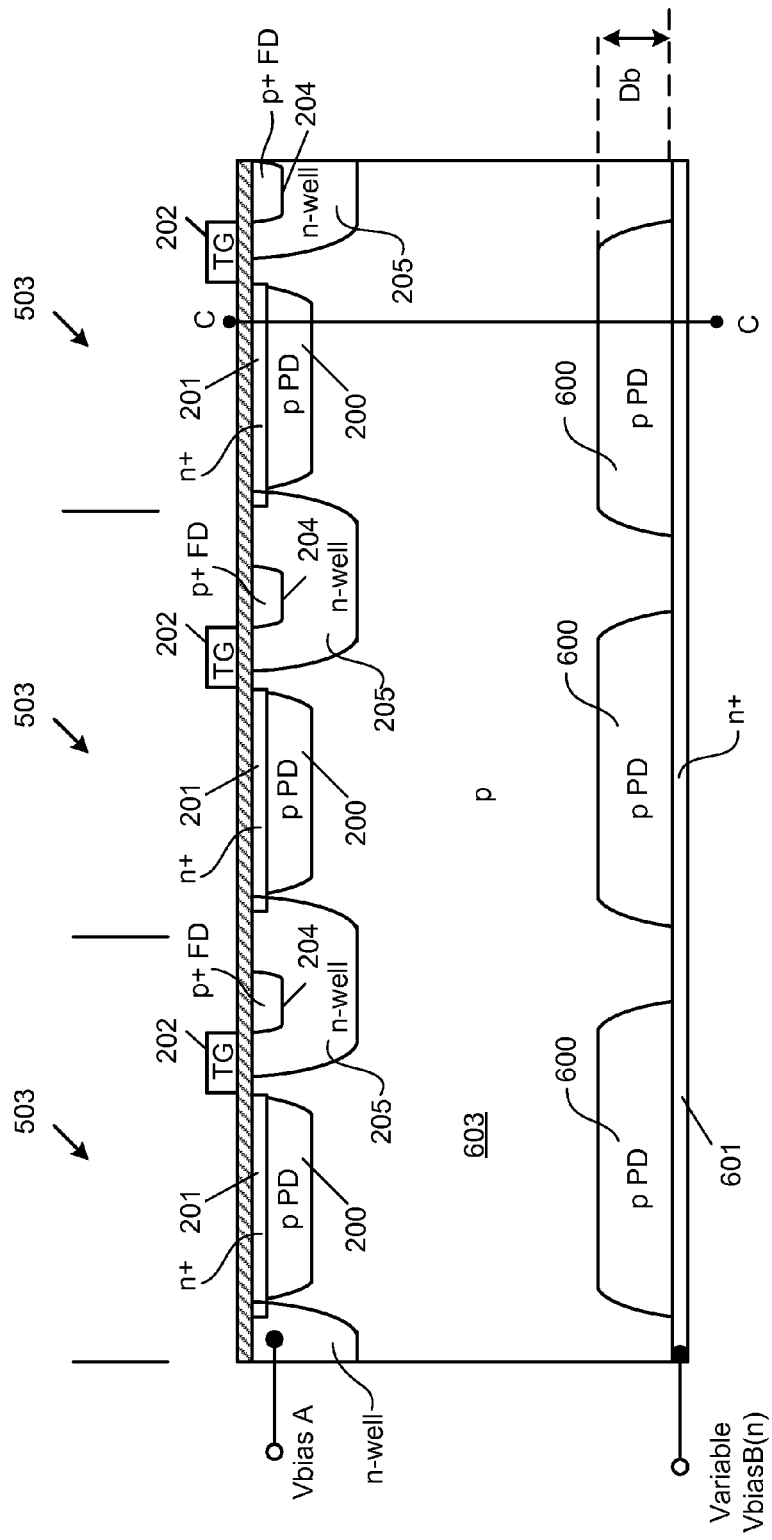
FIG. 6 is a cross-sectional view of a portion of a first image sensor in an embodiment in accordance with the invention.

Next, the backside pixel structure is detailed in conjunction with the front-side pixel components. It should be noted that the details of the non-front-side components and structure of the pixel can be used in combination with the various exemplary embodiments of the front-side component pixel structures and schematics. FIG. 6 is a cross-sectional diagram of a portion of a first image sensor illustrating three pixels in an embodiment in accordance with the invention. Pixel 503 is a non-shared pixel that includes a p-type substrate layer 603, front-side p-type photodetectors 200, front-side n-type pinning layer 201, backside p-type photodetectors 600, backside n-type pinning layers 601, transfer gates 202, p-type charge-to-voltage conversion mechanisms 204 and front-side n-wells 205. The front-side pinning layers 201 and n-wells 205 are connected to a potential VbiasA. The backside pinning layers 601 are connected to a time variant and programmable potential Variable VbiasB (VVbiasB). Several advantageous effects can be provided by making the backside pinning layers 601 separate and electrically isolated from the front-side pinning layers 201 and n-wells 205, and by applying a time variant signal VVbiasB to the backside pinning layer 601. First, photogenerated charge, (holes in the present embodiment), created from multiple spectra can be collected and separately readout in each pixel. Second, a high performance global shutter is provided. Third, the structure can be flexibly implemented and operated. These are described in more detail in subsequent paragraphs.

Figure 7:
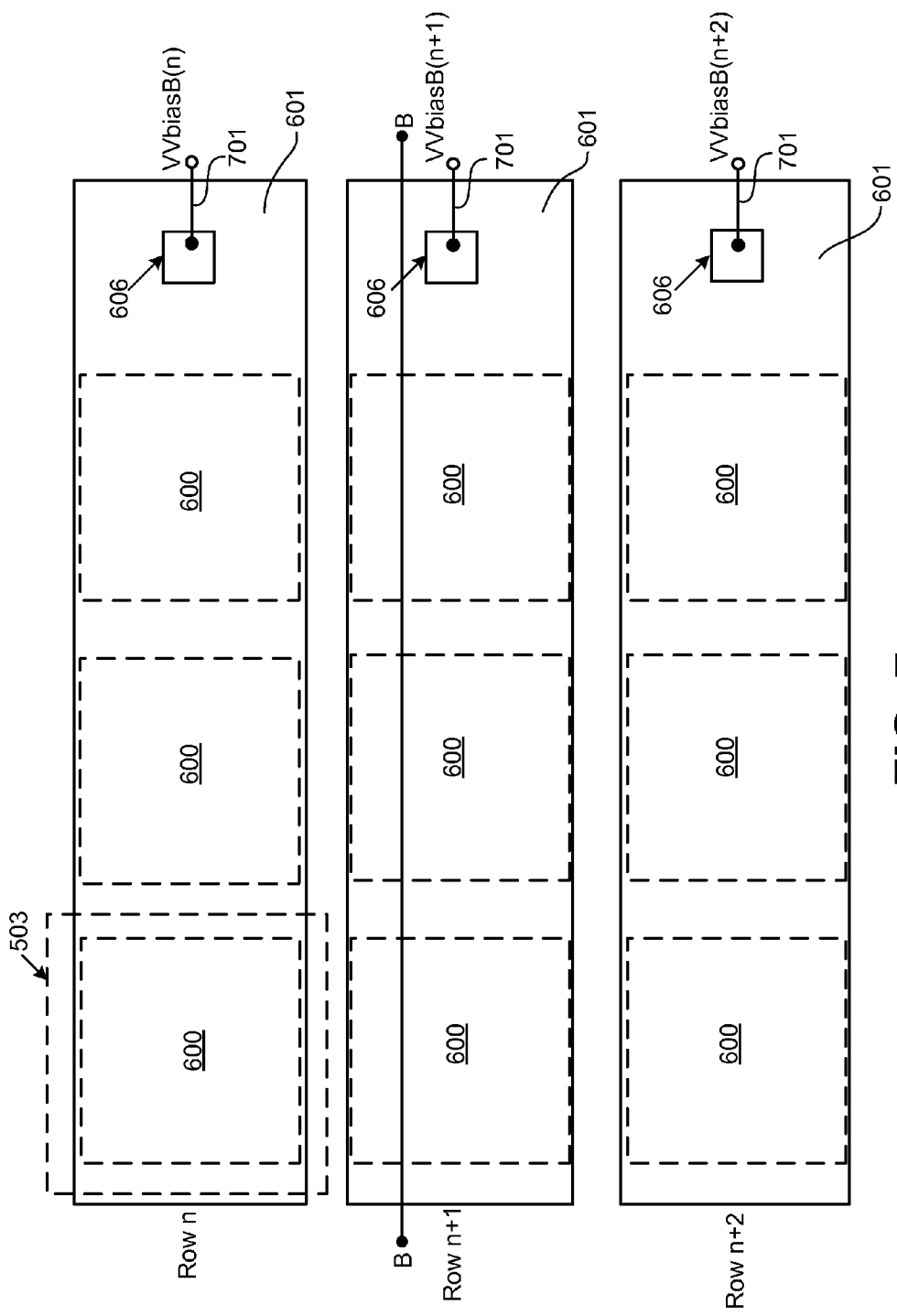
FIG. 7 illustrates a backside plan view of a portion of an image sensor suitable for use in the image sensor shown in FIG. 6 in an embodiment in accordance with the invention.

FIG. 7 depicts a backside plan view of a portion of the image sensor shown in FIG. 6 in an embodiment in accordance with the invention. FIG. 7 illustrates three rows (row n, row n+1, row n+2) of three pixels 503. The cross-sectional diagram of the image sensor shown in FIG. 6 is taken along line B-B in FIG. 7. It should be noted that the backside pinning layer 601 is configured as isolated regions per row in the illustrated embodiment. A connection to the VVbiasB(n), where (n) indicates the address of a row driver output signal that is outputting VVbiasB for row n, is provided in a number of embodiments. In one embodiment in accordance with the invention, a backside contact 606 is provided in at least each row of pixels. A backside conductor 701 is provided to connect the output of a per row based output signal VVbiasB(n) to the backside contact 606 in each row.

Embodiments in accordance with the invention are not limited to the layout and backside pinning layer connection shown in FIG. 7. Other layouts and pinning layer connections can be used in other embodiments in accordance with the invention. By way of example only, the backside pinning layer 601 connections can be made from front-side contacts and interconnects to a deep n-type region that connects to the backside pinning layer 601. By way of example only the backside pinning layer 601 layout can be a large single area for the imaging array 504 in the case where a global integrate and transfer operation is employed, as subsequently described in conjunction with FIGS. 12 and 13. Alternately, the backside pinning layer 601 can be configured as isolated regions that are other than on a row basis.

Figure 8A:
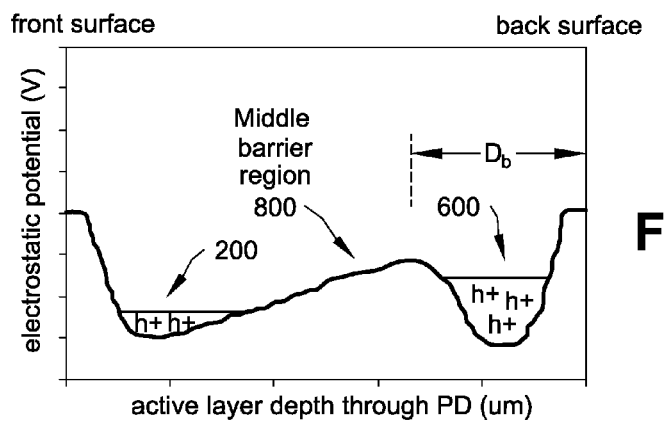
FIGS. 8a-8e depict electrostatic potential profiles along line C-C in FIG. 6 and associated with the timing diagram of FIG. 9 in an embodiment in accordance with the invention.

An electrostatic potential profile along line C-C in FIG. 6 is shown in FIG. 8a. In FIG. 8a, VbiasA and VVbiasB are held at the same voltage. The pixel is designed so that a middle barrier region 800 (an electrostatic barrier) exists between the front-side photodetectors 200 and backside photodetectors 600. This middle barrier region 800 can be formed using several methods. In a first example, the middle barrier region 800 is formed by the selected energies and doses of the front-side and backside photodetector implants. The front-side and backside photodetector implants are kept a predetermined distance from each other to form the middle barrier region 800. Other methods known in the art can be utilized. By way of example only, selective doping of substrate layer 603 at the appropriate depth, where a more lightly doped p-type region at a predetermined depth is used in conjunction with the depth and range of front-side and backside diode implants.

Figure 8B:
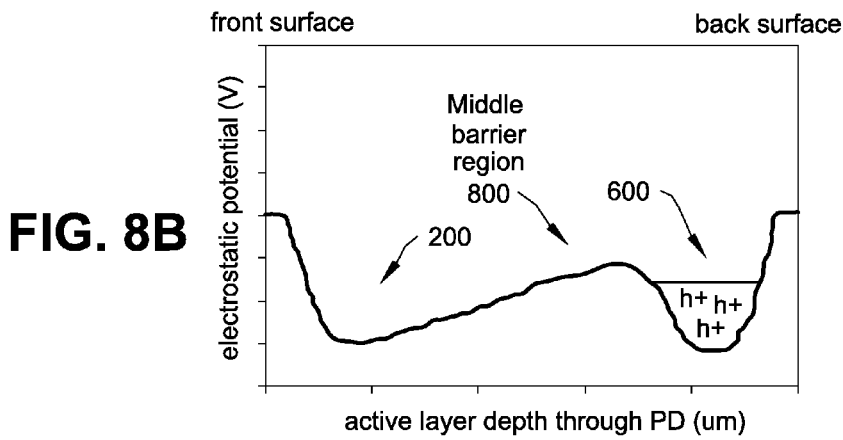
Figure 8C:
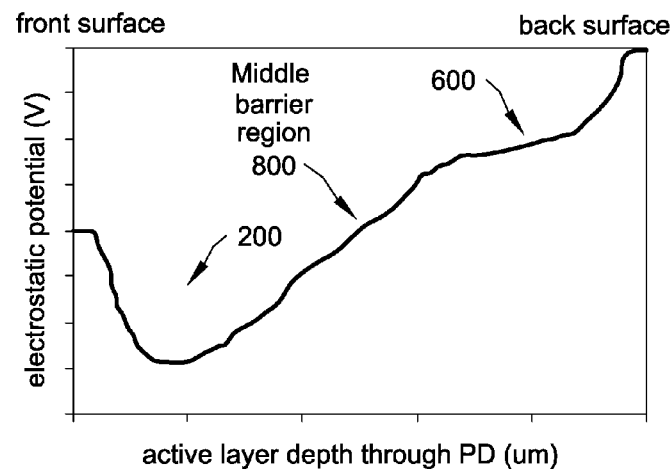
Figure 8E:
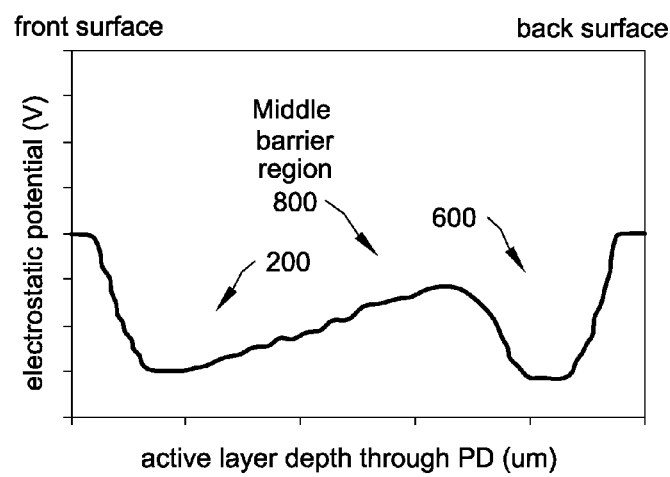
Figure 8D:
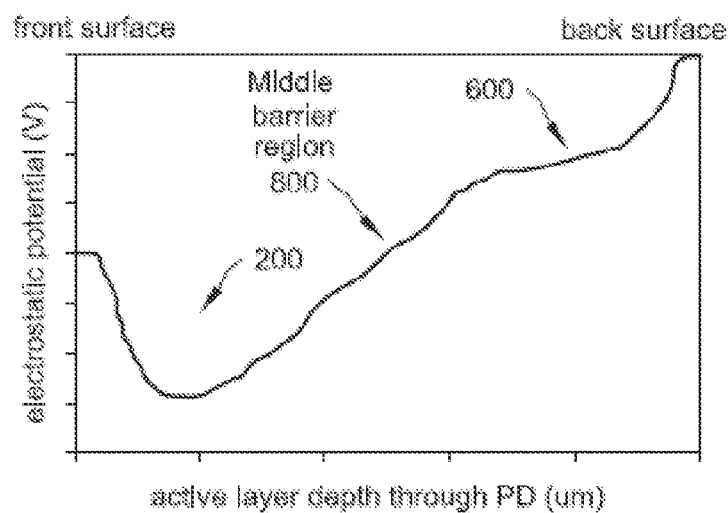
Figure 9:
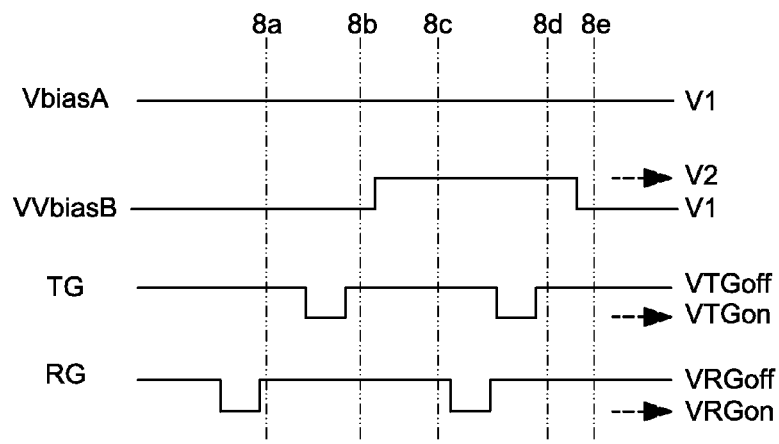
FIG. 9 illustrates one example of a timing diagram for a method of operating the image sensor shown in FIG. 6 in an embodiment in accordance with the invention

A first exemplary method of operating the image sensor shown in FIGS. 6 and 7 is now described in conjunction with the timing diagrams of FIG. 9 and corresponding electrostatic potential versus depth diagrams of FIGS. 8a-8e. Those skilled in the art can implement a row based rolling shutter mode with the timing diagrams of FIG. 9. Consequently, only the VbiasA, VVbiasB, transfer gate (TG) (e.g., transfer gate 202) and reset gate (RG) (e.g., reset gate 208) timing signals are shown in FIG. 9.

Referring now to FIGS. 8a and 9, the integration phase is shown where the photodetectors collect and store photogenerated charge in response to incident light. The electrostatic potential diagram in FIG. 8a is for the time labeled 8a in FIG. 9. In this integration phase, the front-side and backside pinning layers (e.g., layers 201 and 601 respectively) are at the same or similar voltage V1. Voltage V1 is typically the positive supply voltage for the CMOS image sensor pixel array, although other specific voltage levels can be utilized. At time 8a, there are two isolated fully depleted photodetector collection regions, one at the front-side 200 and one at the backside 600, separated by a middle barrier region in the embodiment of FIG. 6. Each pixel 503 in FIG. 6 includes a middle barrier region disposed in substrate layer 603 between front-side photodetector 200 and backside photodetector 600 in an embodiment in accordance with the invention. If the image sensor is a back-illuminated image sensor where light impinges on the backside, more photogenerated charge from blue light or short wavelength illumination is collected in the backside photodetector 600 and more photogenerated charge from red light or long wavelength illumination is collected in the front-side photodetector 200. The specific spectrums that are collected in the backside and front-side photodetectors are determined by the specific thickness of the p-type substrate layer 603 and the location of the middle barrier region 800 within the substrate layer 603. For example, the backside photodetector 600 can be implemented at a small depth location, ($D_b$ in FIG. 6), as measured from the back surface, so that primarily photogenerated charge from blue light will be collected in the backside photodetector 600 when the image sensor is illuminated from the backside. Image sensors having different substrate layer thickness, front-side photodetector depth, and backside photodetector depth can be implemented without departing from the scope of the invention.

Next, with reference to FIGS. 6, 8b, and 9, one example of a readout method for the front-side photodetector 200 is described. At time 8b, the front-side pinning layer 201 and backside pinning layer 601 are the same or at similar voltage V1. First, the charge to voltage conversion region 204 is reset by pulsing the reset gate (e.g., RG 208 in FIG. 5) on and off while Vpix 214 is held at an appropriate potential. Next, the reset level of charge to voltage conversion region 204 is readout and stored (not shown in the timing diagram). The transfer gate (e.g., TG 202) is pulsed on and off to transfer charge from the front-side photodetector 200 to charge to voltage conversion region 204. Next, the signal level of the charge to voltage conversion region 204 is readout and stored (not shown in the timing diagram).

Referring now to FIGS. 6, 8c and 9, the backside photodetector 600 transfer phase is described. VVbiasB connected to the backside pinning layer 601 is changed to a voltage V2 sufficiently larger than the front-side pinning layer 201 voltage VbiasA (set to V1) to create an electrostatic potential profile from the backside photodetector 600 through to the front-side photodetector 200 to form an electric field that transfers photogenerated charge (holes in the present embodiment), from the backside photodetector 600 to the front-side photodetector 200. Charge that was collected in the backside photodetector 600 is transferred to the front-side photodetector 200, as shown in FIG. 8c. After the backside to front-side charge transfer is complete, VVbiasB voltage may remain at voltage V2, or VVbiasB can be returned to voltage V1. In the timing diagram shown in FIG. 9, VVbiasB remains at voltage V2.

Note that if the conductivity types of the image sensor are reversed, the VVbiasB would be set to a voltage less than that of VbiasA to create an electrostatic potential profile from the backside photodiode 600, through to the front-side photodetector 200 to transfer electrons in the backside photodetector 600 to the front-side photodetector 200.

Referring to FIGS. 6, 8d and 9, one example of a method for reading out the charge initially integrated in the backside photodetector 600 and now stored in the front-side photodetector 200, is described. The readout method uses the same timing as described for the readout of the front-side photodetector 200. At time 8d, the front-side pinning layer 201 is at voltage V1 and backside pinning layer 601 is at voltage V2. The charge to voltage conversion region 204 is reset by pulsing the reset gate (e.g., RG 208 in FIG. 5) on and off while Vpix 214 is held at an appropriate potential. Next, the reset level of the charge to voltage conversion region 204 is readout and stored (not shown in the timing diagram). The transfer gate (e.g., TG 202) is pulsed on and off to transfer the charge from the front-side photodetector 200 to charge to voltage conversion region 204. Next, the signal level of the charge to voltage conversion region 204 is readout and stored (not shown in the timing diagram)

Finally, referring to FIGS. 6, 8e and 9, VVbiasB is returned to voltage V1 and the integration phase begins for the next video frame or still image capture.

Figure 8F:
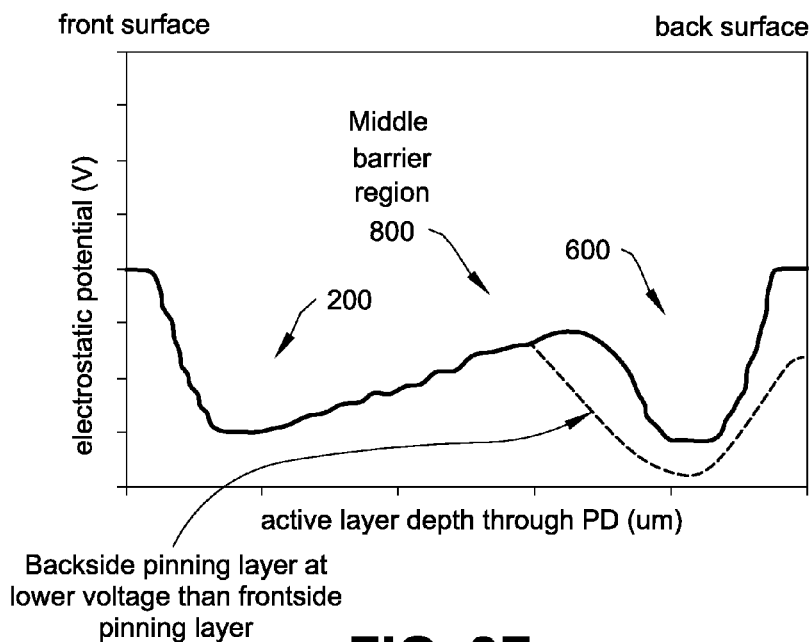
FIG. 8f depicts an electrostatic potential profile along line C-C in FIG. 6 in another embodiment in accordance with the invention.

FIG. 8f depicts an alternate condition for the integration phase of the image sensor. In this embodiment, the backside pinning layer 601 is biased at a potential lower than that of the front-side pinning layer 201. When the potential of VVbiasB is lower than the potential of VbiasA, the charge handling capacity of the backside photodetector 600 is increased compared to the embodiment shown in FIG. 8a. Note that if the conductivity types of the image sensor are reversed, VVbiasB would be set to a voltage level that is higher than that of VbiasA to create a larger electrostatic potential well for electrons in the backside photodetector.

Figure 10:
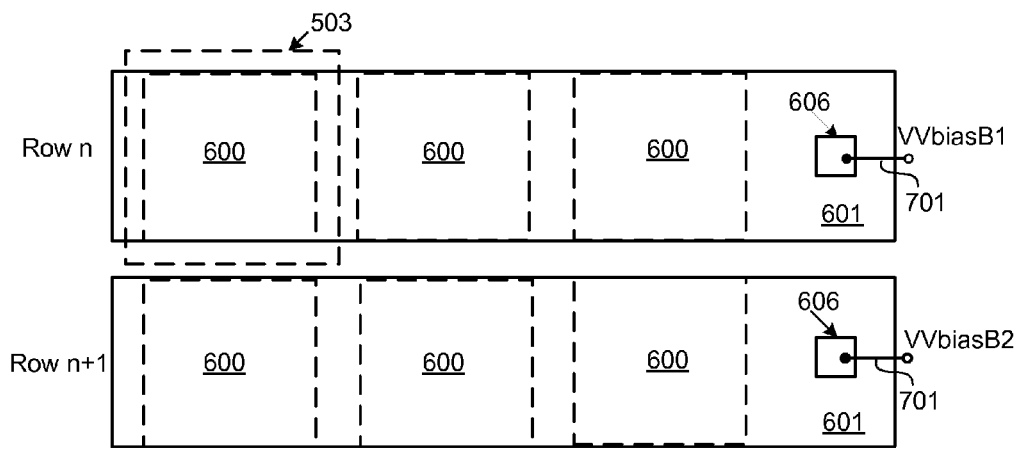
FIG. 10 depicts a backside plan view of a portion of an image sensor suitable for use in the image sensor shown in FIG. 6 in an embodiment in accordance with the invention.
Figure 11:
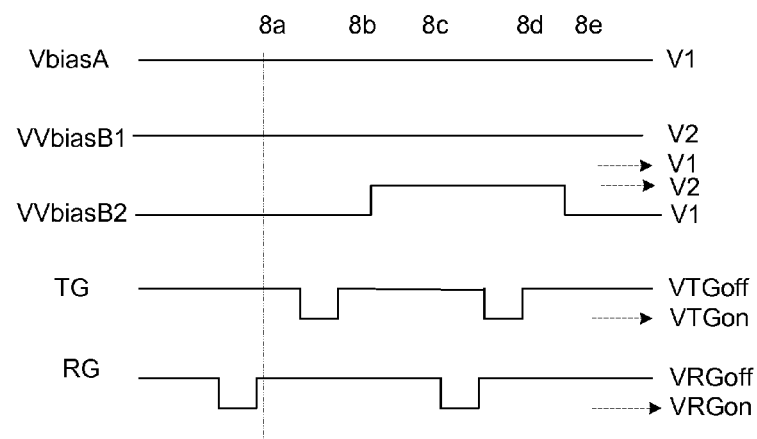
FIG. 11 illustrates one example of a timing diagram for a method of operating the image sensor shown in FIG. 10 in an embodiment in accordance with the invention.

In another embodiment in accordance with the invention, different backside pinning layer potentials $VVbiasB_1$ and $VVbiasB_2$ are applied to specified separate subsets of pixels in a pixel array. FIG. 10 is a backside plan view of a portion of the image sensor shown in FIG. 6 in an embodiment in accordance with the invention. FIG. 10 illustrates two rows (row n, row n+1) of three pixels 503 that are used to describe the second embodiment. The backside pinning layers in alternate rows of pixels in the pixel array are electrically connected to a first and second backside pinning layer voltage, $VVbiasB_1$ and $VVbiasB_2$ respectively. In one embodiment, $VVbiasB_1$ is equal to the front-side pinning layer bias potential VbiasA. The even rows have an initial backside pinning layer voltage $VVbiasB_2$ that is greater than the front-side pinning layer bias potential VbiasA. As a result, the pixels in the odd rows have the initial electrostatic potential during the integration phase as shown in FIG. 8a with isolated front-side and backside photodetector collection regions as previously described. The pixels in the even rows have the initial electrostatic potential during the integration phase as shown in FIG. 8d where the front-side and backside photodetectors are connected to form a single high charge capacity collection region. The integration and readout methods for the odd rows can use the timing diagrams of FIG. 9. The timing diagrams for the integration and readout of the even rows is shown in FIG. 11. Note that the timing diagram of FIG. 11 provides two different integration times for the pixels in the even rows. A first signal associated with a longer integration time is readout at time 8b, while a second signal associated with a shorter integration time is readout at time 8d. This can provide extended dynamic range image capture in an image sensor.

Additional biasing patterns can be implemented without departing from the scope of this embodiment. For example, the biasing of the backside pinning layer can be patterned in groups that are not related to odd and even rows. This includes alternating groups of two or more rows, column based biasing patterns, or other subsets.

Additionally, alternate timing signals can be applied without departing from the scope of this embodiment. For example a single readout can be performed for the pixels in the even rows. For faster frame rate, windowing or sub-sampling can be employed. For shared amplifier pixels, charge binning on the charge to voltage conversion regions can be implemented. Different integration times can be implemented for the different groups of pixels.

The pixels that are associated with different biasing of backside pinning layer can be coupled or combined with specific color filter array (CFA) patterns for mixed illuminant imaging. By way of example only, the pixels associated with VVbiasB2 are coupled with bandpass color filter elements, while the pixels associated with VVbiasB1 are coupled to no color filter element. Other CFA patterns coupled with the respective backside pinning layer biases can be employed without departing from the scope of this invention.

Further, the physical depth and thickness of the backside or front-side photodetectors can be tailored to the pixels that are associated with different backside pinning layer biases or particular color filter elements. For example, the backside photodetector depth from the backside surface, $D_b$, can be correlated to the color filter element for pixels associated with VVbias2. In this manner pixels with a blue color filter element can have a shallow backside photodetector, pixels with a red color filter element a deeper backside photodetector, and pixels with a green color filter element can have a depth in between that of the blue and red pixels.

Also, the dopant implant used to produce the backside photodetector can be different for odd and even rows, alternating groups of two or more rows, column based, or other subsets. In another example, the backside photodetector dopant implant for a first set of pixels can be a very low dose or not patterned at all. In this case, the pixels in the first set would have no middle barrier region 800. The electrostatic potential profile from the backside surface to the front-side surface for the first set of pixels would look like that in FIG. 8c or 8d without having to set VVbiasB to a more positive voltage. This first set of pixels is comprised effectively of only front-side photodetectors 200. Pairing this first set of pixels with a Panchromatic (white) color filter element can create a subset of pixels with better luminance performance.

In a third embodiment in accordance with the invention, an image sensor can provide a global electronic shutter (GES) operation. This is accomplished by implementing global timing of the backside pinning layer potential VVbiasB. This mode of operation is shown in the electrostatic potential diagrams and the timing diagram of FIGS. 12 and 13 respectively.

Figure 12A:
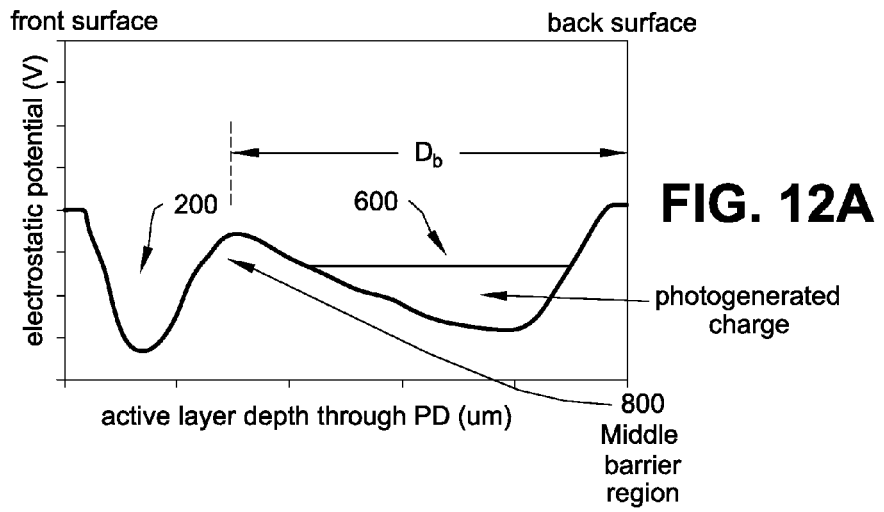
FIGS. 12a-12d depict electrostatic potential profiles along line C-C in FIG. 6 associated with the timing diagram in FIG. 13 in an embodiment in accordance with the invention

Referring to FIGS. 6, 7, 12a and 13, the integration phase for row n, row n+1 and row n+2 is shown. The electrostatic potential diagram in FIG. 12a is for the time labeled 12a in FIG. 13. In this integration phase, the front-side and backside pinning layer voltages VbiasA and VVbiasB are at the same or similar voltage V1. For the embodiment shown in FIG. 6, voltage V1 is typically the positive supply voltage for the CMOS image sensor pixel array, although other specific voltage levels can be utilized. There are two isolated fully depleted photodetector collection regions at the front-side and backside separated by a middle barrier region 800. In visible wavelength imaging applications, such as a digital still camera (DSC), an infra-red (IR) cut-off filter is typically employed. By making the depth of the backside photodiode, $D_b$, sufficient to collect wavelengths out to 600 nm-650 nm (typical IR filter cut-off wavelengths), the front-side photodetector 200 becomes effectively shielded from incident illumination, such as visible light. For example, if the depth of the backside photodetector is $D_b$ as measured from the back surface, and the depth $D_b$ is designed to be $\geq 17$ um, 99.9% of illumination $\leq 600$ nm is collected in the backside photodetector 600, providing 1,000:1 light shield ratio for the front-side photodetector 200 which acts as a storage node at 600 nm, and essentially perfect light shielding at wavelengths $\leq 530$ nm. So for DSC applications, substantially all of the photogenerated charge is collected in the backside photodetector 600, and no photogenerated charge is collected in the front-side photodetector 200. The integration phase is done simultaneously for all of the pixels in the array in an embodiment in accordance with the invention.

Figure 12B:
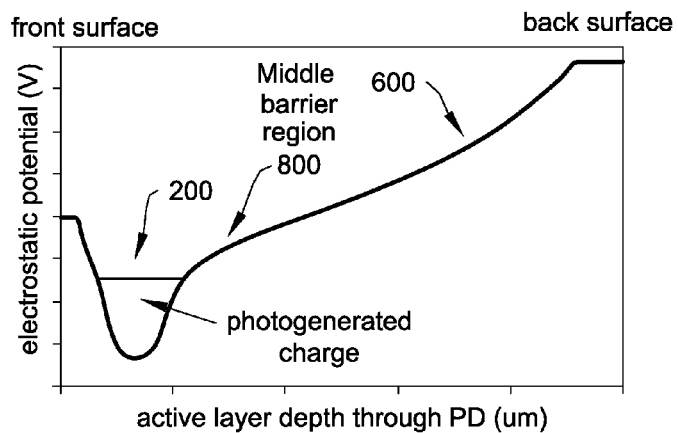
Figure 12C:
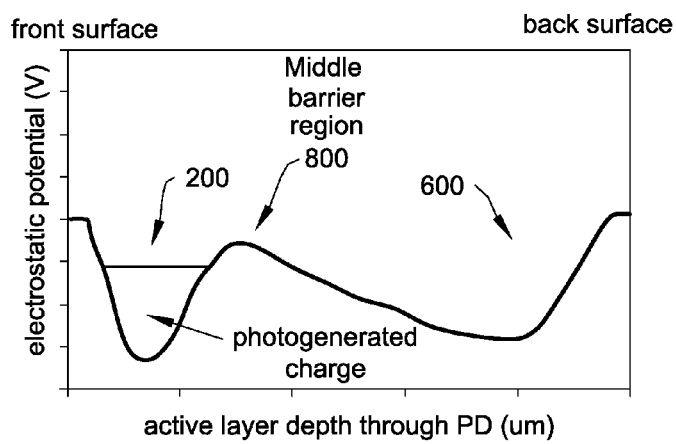
Figure 13:
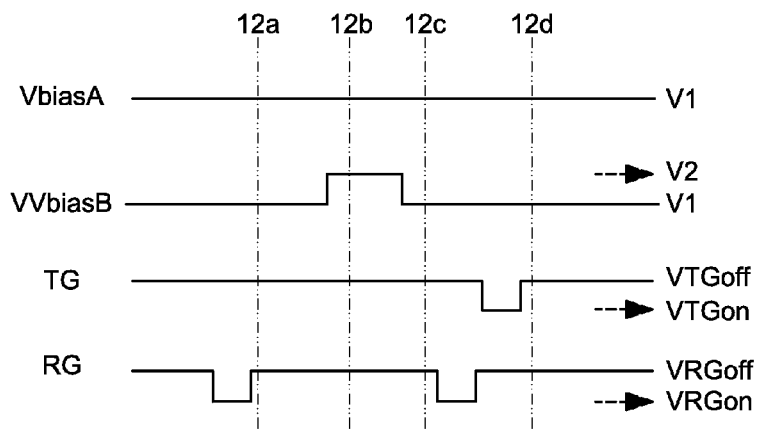
FIG. 13 illustrates one example of a timing diagram for a global shutter method of operating the image sensor shown in FIGS. 6, 7 and 12 in an embodiment in accordance with the invention.

Next, with reference to FIGS. 12b, 12c and 13, the backside photodetector 600 transfer phase is shown. In FIG. 12b, the backside pinning layer potential VVbiasB is changed to a voltage V2 sufficiently larger than the front-side pinning layer potential VbiasA to create an electrostatic potential profile from the backside photodetector 600 to the front-side photodetector 200, to transfer charge (e.g., holes) from the backside photodetector 600 to the front-side photodetector 200. Referring to FIG. 12c, the backside pinning potential VVbiasB is returned to voltage V1. The change in potential VVbiasB is applied to all rows of the image sensor simultaneously, so that all pixels in the image sensor undergo the backside photodetector 600 to front-side photodetector 200 charge transfer simultaneously. Now the backside photodetector 600 can commence integration of photogenerated charge for the next image while the transferred charge stored in the front-side photodetector 200 is read out.

Figure 12D:
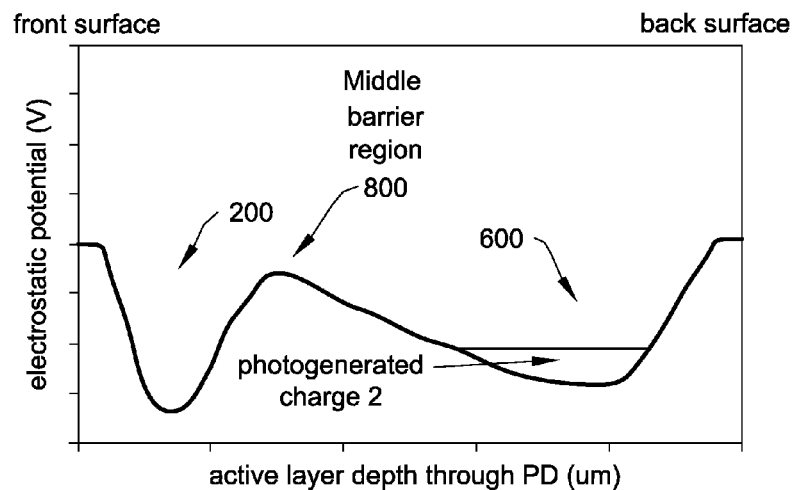

Referring to FIGS. 12d and 13, the charge stored in the front-side photodetector 200 is readout. The readout from the front-side photodetector 200 is done one row at a time in a rolling shutter method in one embodiment in accordance with the invention. First, the charge to voltage conversion region 204 is reset by pulsing the reset gate (e.g., RG 208 in FIG. 5) on and off. Next, the reset level of the charge to voltage conversion region 204 is readout and stored (not shown in the timing diagram). The transfer gate (e.g., TG 202) is pulsed on and off to transfer charge from the front-side photodetector 200 to the charge to voltage conversion region 204. Next, the signal level of the charge to voltage conversion region 204 is readout and stored (not shown in the timing diagram). Other readout methods can be used in other embodiments in accordance with the invention.

With the global electronic shutter mode of operation, the front-side photodetector 200 serves as a low dark current storage node. The dark current of a front-side pinned photodiode is extremely low. The readout method described in conjunction with FIGS. 12 and 13 is true correlated double sample (CDS) and therefore has very low read noise. This third embodiment provides an image sensor having global electronic shutter, low dark current and light shielded storage node vertically integrated under the backside photodetector. Thus, a high performance global electronic shutter can be realized with very small pixels. Extremely small pixels are provided when multiple front-side photodetectors (storage nodes) share charge to voltage conversion regions, amplifier transistors, and reset transistors. This can also be applied to large pixels to improve fill factor and charge capacity.

Figure 14:
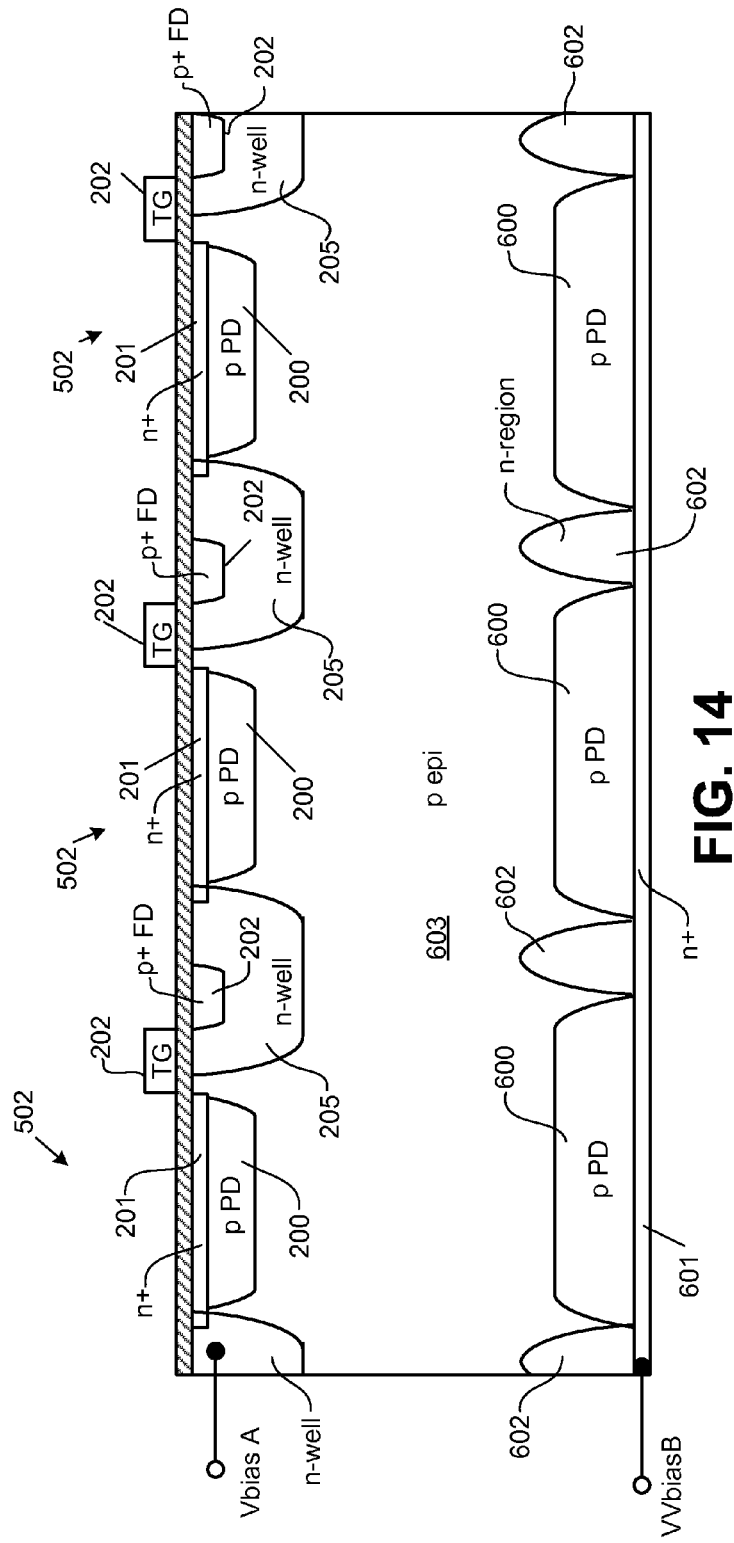
FIG. 14 is a cross-sectional view of a portion of a second image sensor in an embodiment in accordance with the invention.
Figure 15:
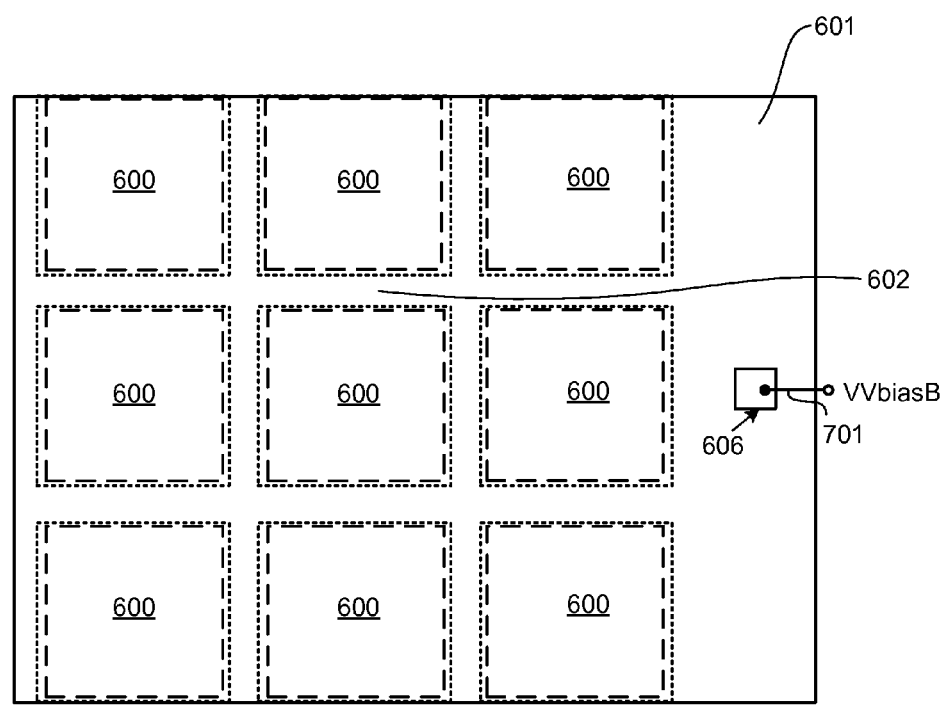
FIG. 15 illustrates a backside plan view of a portion of the image sensor shown in FIG. 14 in an embodiment in accordance with the invention.

A global electronic shutter operation can optionally be implemented with an alternate backside pinning layer 601 layout. Referring now to FIGS. 14 and 15, the backside pinning layer 601 does not have to be configured as a row isolated layer for global shutter mode operation. FIGS. 14 and 15 are analogous to FIGS. 6 and 7 with the difference being the backside pinning layer 601 is a large spatially continuous region for the pixel array (see FIG. 15). Also, to provide better lateral isolation for the backside photodetectors 600 shown in FIG. 14, n-type isolation regions 602 can be disposed between the backside photodetectors 600 and adjacent to the backside pinning layer 601. These n-type isolation regions 602 may be included in the FIG. 6 embodiment as well.

Figure 16:
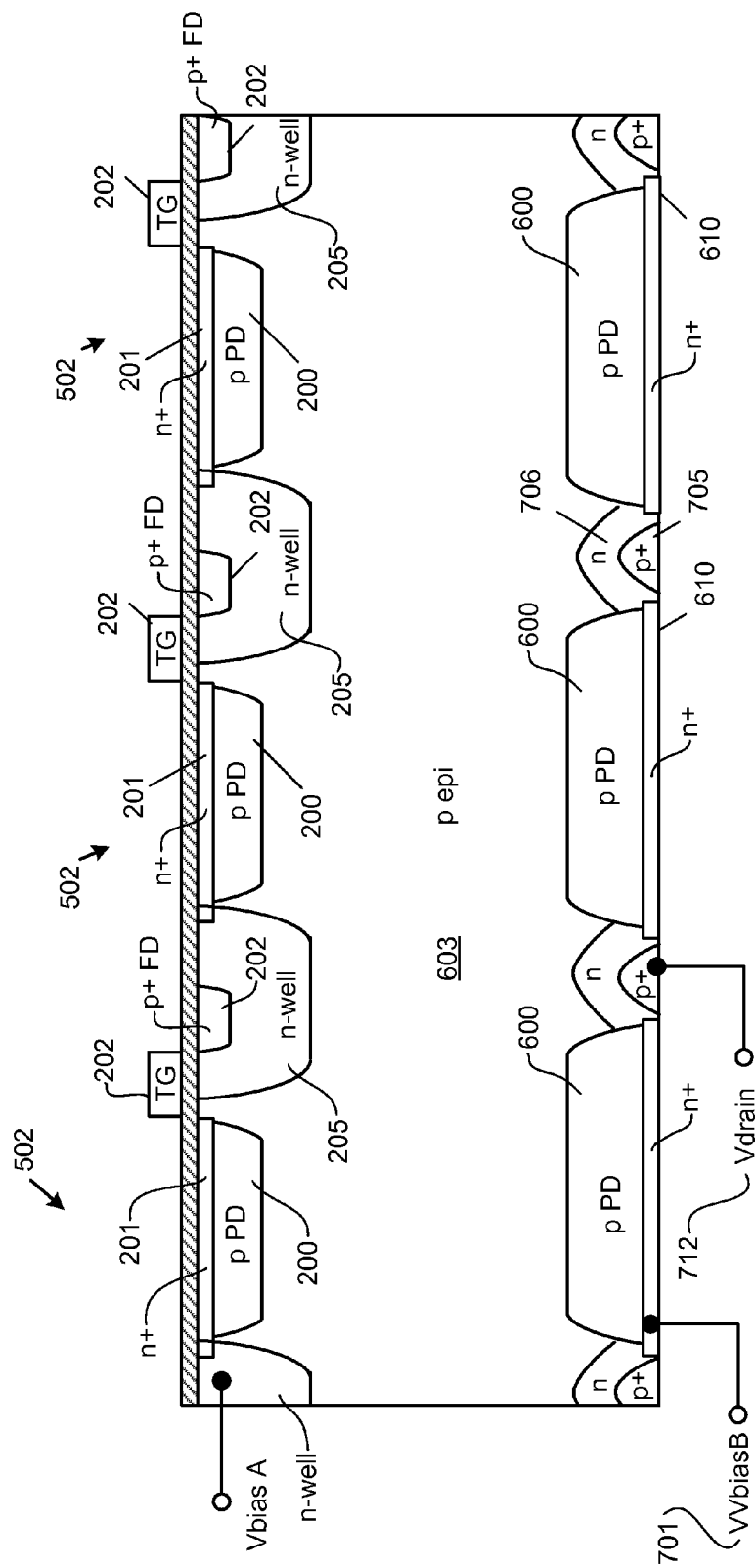
FIG. 16 is a cross-sectional view of a portion of a third image sensor in an embodiment in accordance with the invention.

For global shutter applications, performance is improved in high light situations with the addition of an antiblooming structure. FIG. 16 illustrates a portion of a third image sensor in an embodiment in accordance with the invention. In the illustrated embodiment, antiblooming structures are disposed near the backside photodetectors 600. A lateral overflow drain is formed by a p+ region 705 that is biased at a lower potential (Vdrain 712) than the backside n+ pinning region 610 potential (VVbiasB 701). Vdrain 712 is an adjustable and programmable potential in an embodiment in accordance with the invention.

A properly doped n-type backside barrier region 706 sets the barrier between the p+ drain 705 and the p-type backside photodetector 600. This barrier controls the filling level of the backside photodetector 600 before excess charge spills into the drain 705. A lightly doped p-region (not shown) could be included between the p+ drain 705 and n-type backside barrier region 706 to reduce the magnitude of the electric fields at the p+/n junction. High electric fields are known to increase the number of defective pixels commonly referred to as bright points or bright clusters.

The configuration in FIG. 16 is commonly referred to as a virtual gate lateral overflow drain (VGLOD). Here the barrier from the backside photodetector 600 to the p+ lateral overflow drain (LOD) region 705 is lower than that of the middle barrier region 800 between the backside photodetector 600 and front-side photodetector 200. The backside pinning regions 610 are spaced away from the p+ LOD region 705 and separated by an n-type backside barrier region 706 to prevent the creation of a zener diode. The n-type backside barrier region 706 can be made deeper or shallower than that shown in FIG. 16 depending on the desired characteristics of the image sensor. This VGLOD can be implemented in both rolling and global shutter operation to prevent charge from blooming from backside photodetector 600 to front-side photodetector 200. Note that the blooming path for the front-side photodetector 200 is the same as is done with normal front-side photodetector 200 operation to the charge to voltage conversion region 204. For increased blooming protection and additional p+ LOD can be added adjacent to the front-side.

Figure 17:
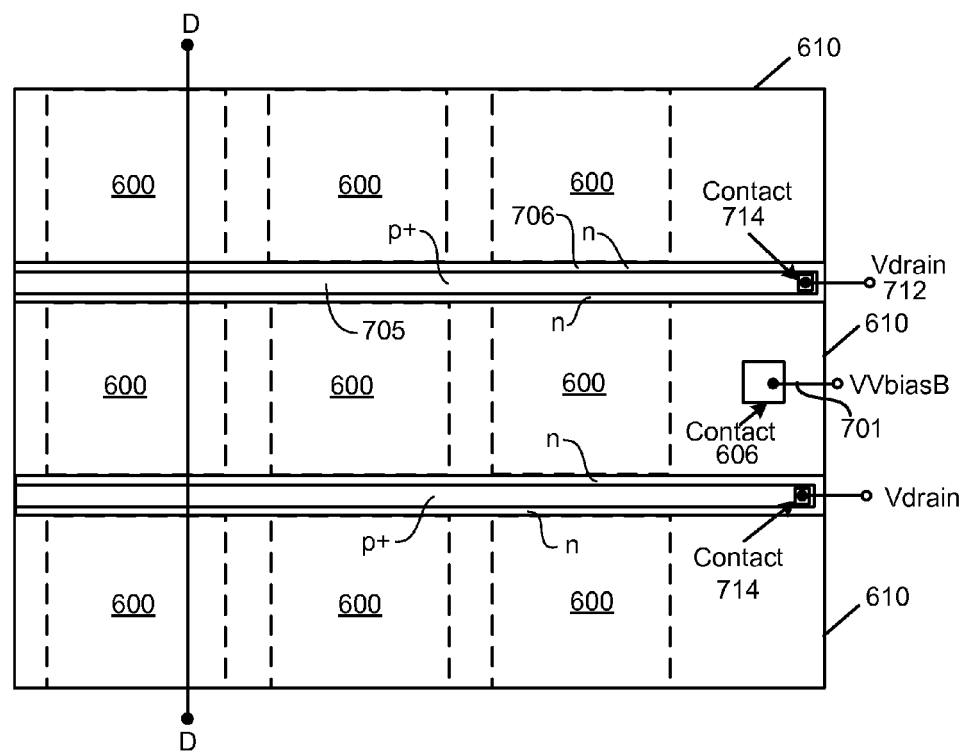
FIG. 17 illustrates a backside plan view of a portion of the image sensor of FIG. 16 in an embodiment in accordance with the invention.
Figure 18:
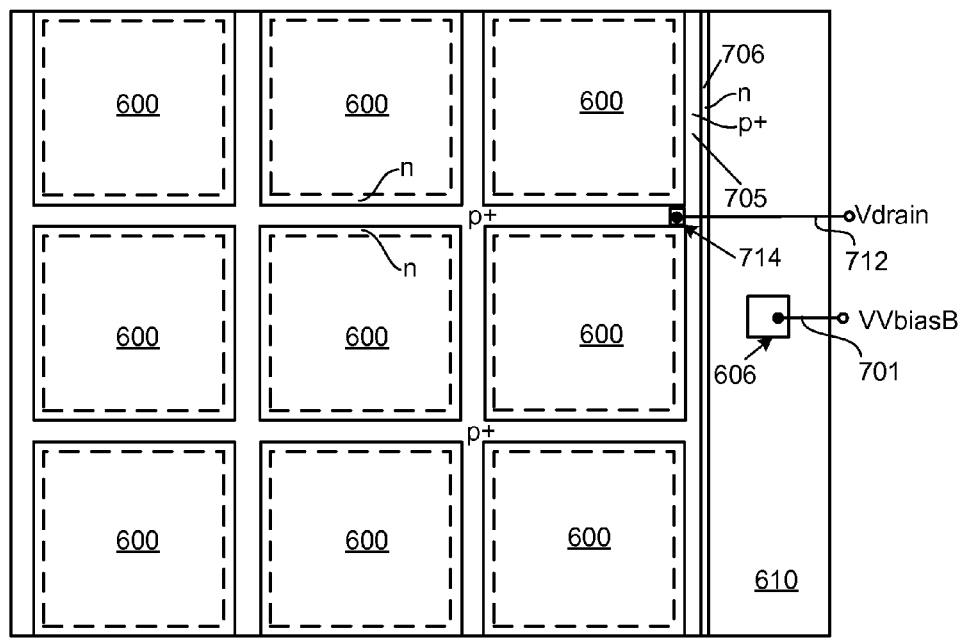
FIG. 18 depicts a backside plan view of a portion of an alternate embodiment of the image sensor shown in FIG. 16.
Figure 19:
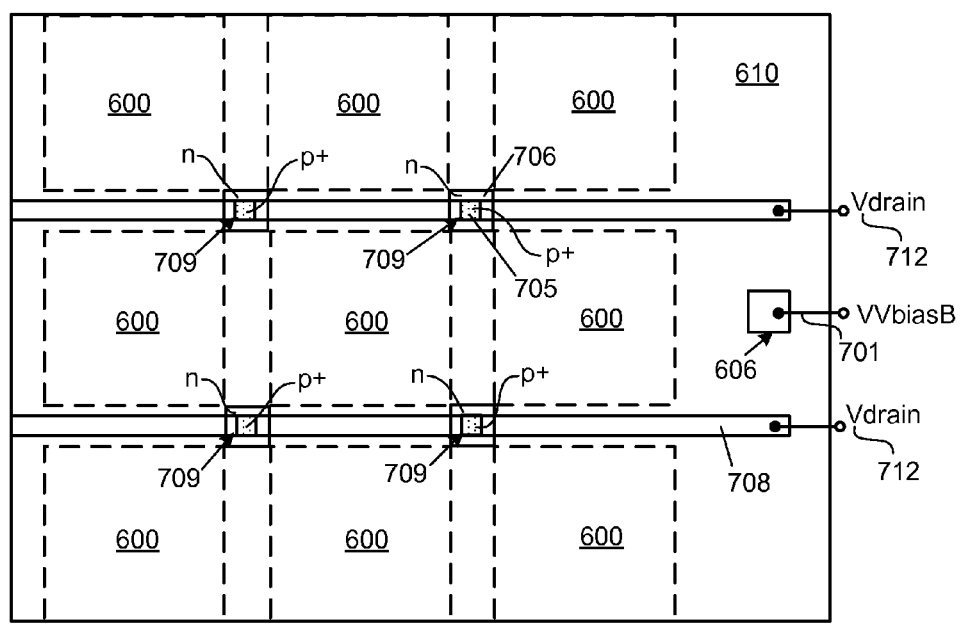
FIG. 19 illustrates a backside plan view of a portion of an alternate embodiment of the image sensor of FIG. 16.

Two exemplary backside plan views of a portion of the image sensor shown in FIG. 16 are illustrated in FIGS. 17 and 18. The cross-sectional view of FIG. 16 is taken along line D-D shown in FIG. 17. In FIG. 17, the p+ LOD 705 is implemented as rows with contacts 714 at the periphery of the pixel array. In FIG. 18, the p+ LOD 705 forms a grid that likewise has contacts 714 at the periphery of the pixel array.

Contact to the p+ LOD 705 does not have to be made at the periphery of the pixel array. Metal wires 708 can be disposed along the backside and isolated from the silicon by a dielectric layer. Here contacts 709 are made to the p+ LOD 705 by selectively etching the dielectric between the metal wire 708 and the p+ region. Using metal wires 708 allows the p+ LOD 705 to be isolated regions between adjacent backside photodetectors 600.

To provide proper readout operation of the image sensor, the drain bias (Vdrain 712) should be clocked with VVbiasB 701 when charge is transfer from the backside photodetector 600 to the front-side photodetector 200. In some situations if Vdrain 712 is not clocked with VVbiasB 701, then the barrier between backside photodetector 600 and the p+ LOD 705 will be pulled out before the barrier between the backside photodetector 600 and the front-side photodetector 200. Charge drains to the p+ LOD 705 instead of transferring to the front-side photodetector 200. This operation can be useful for an electronic shutter operation.

Figure 20:
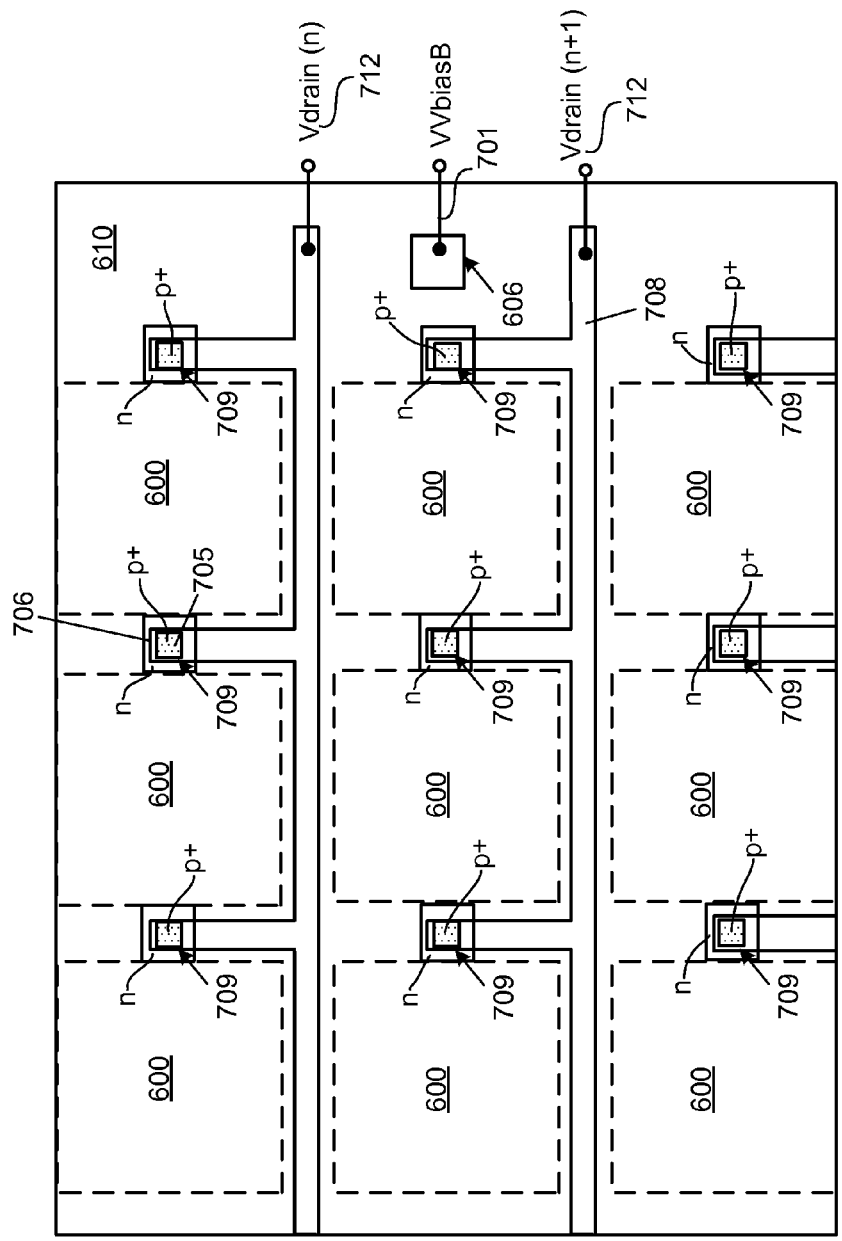
FIG. 20 illustrates a backside plan view of a portion of an alternate embodiment of the image sensor of FIG. 16.

Those skilled in the art will recognize that characterization of an image sensor determines the preferred waveforms to use for VVbiasB 701 and Vdrain 712 for backside photodetector 600 to front-side photodetector 200 transfer operations, and for electronic shutter operations. These preferred waveforms may include delays between VVbias 701 and Vdrain 712, voltage differences, and rise time differences. As illustrated in FIG. 20 contact to the p+ LOD 705 using metal wires 708 can also be accomplished on a row-by-row or column-by-column basis. In this configuration, each row of drain contacts 709 can be clocked independently (Vdrain (n) 712). Taking each Vdrain more negative will electronic shutter each row of backside photodetectors 600. In other words, clocking Vdrain 712 for each row allows electronic shutter of the backside photodetectors 600 row-by-row. This can also provide different integration times in the same frame capture which can provide extended dynamic range image capture.

Finally, it should be noted that independent shuttering of pixels is not restricted to only rows or columns. The pattern of pixels with independent Vdrain (n) 712 could consist of a checkerboard pattern, two independent checkerboard patterns every two rows, or several sub pixel array grids.

Figure 21:
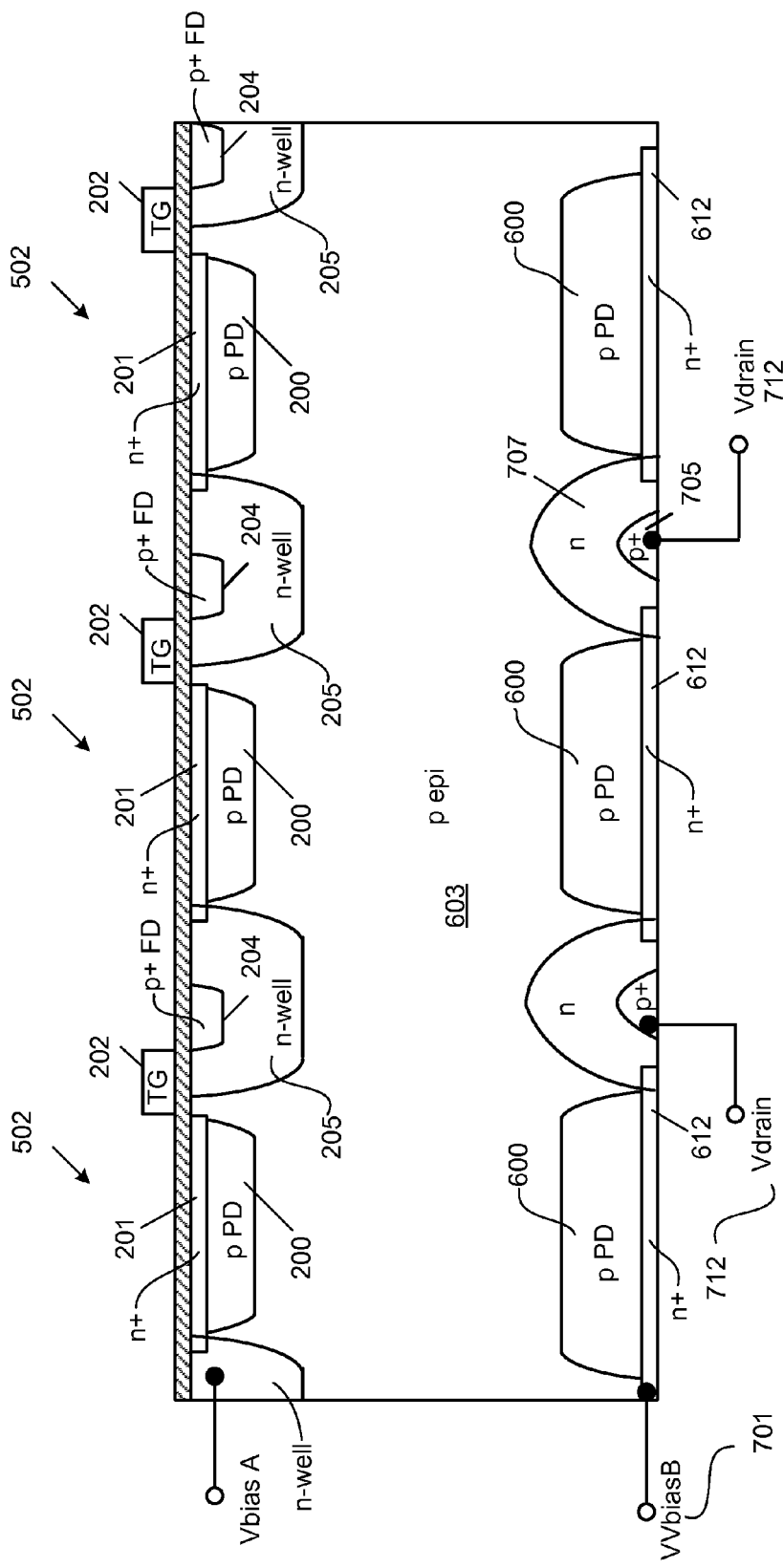
FIG. 21 is a cross-sectional view of a portion of a fourth image sensor in an embodiment in accordance with the invention.
Figure 22:
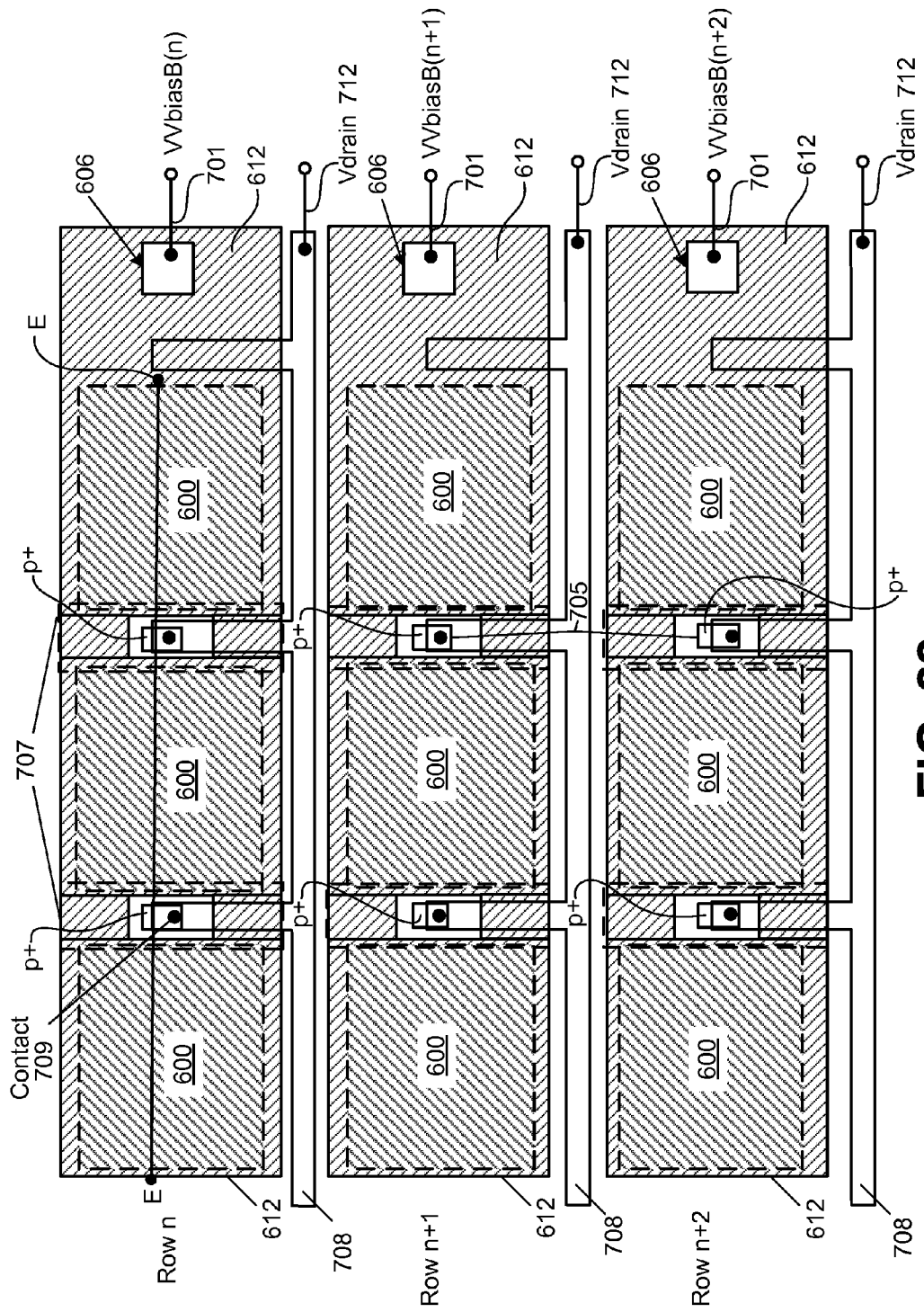
FIG. 22 illustrates a backside plan view of a portion of the image sensor shown in FIG. 21 in an embodiment in accordance with the invention.

In addition to having independent rows or columns of p+ LODs 705, it is possible to have independent rows or columns of n+ backside pinning regions 612. FIGS. 21 and 22 illustrate a portion of a fourth image sensor in an embodiment in accordance with the invention. The cross-sectional view of FIG. 21 is taken along line E-E shown in FIG. 22. As with the image sensor shown in FIG. 16, a p+ LOD 705 is disposed between backside photodetectors 600. Again, during signal integration, the p+ LOD 705 is biased at a lower potential (Vdrain 712) than the backside n+ pinning regions 612 (VVbiasB 701). Typically, for this embodiment, Vdrain 712 is ground. The n-regions 707 set the barrier between the p+ LOD 705 and the p-backside photodetector 600. These n-regions 707 are electrically isolated between rows or columns. For this configuration, since the p+ LOD 705 and the n+ pinning regions 612 are row or column isolated, both can be clocked independently and biased. As with the fourth embodiment, metal wires 708 along the backside can be used to contact the p+ LOD 705. This will provide better conductivity For signal integration VbiasA, and VVbiasB 701 will all have to be properly adjusted. Just like the fourth embodiment, the barrier between the backside photodetectors 600 and p+ LOD 712 should be lower than the barrier between the backside photodetector 600 and the front-side photodetector 200 to provide proper blooming protection. During transfer from the backside photodetector 600 to front-side photodetector 200, VVbiasB 701 is clocked positive. Also, the doping and depth of the barrier n-regions 707 should provide a sufficient barrier between the backside photodetector 600 and p+ LOD 705 during this back to front transfer operation. It is also envisioned that VbiasA can be temporally varied or clocked to provide improved transfer performance.

Figure 23:
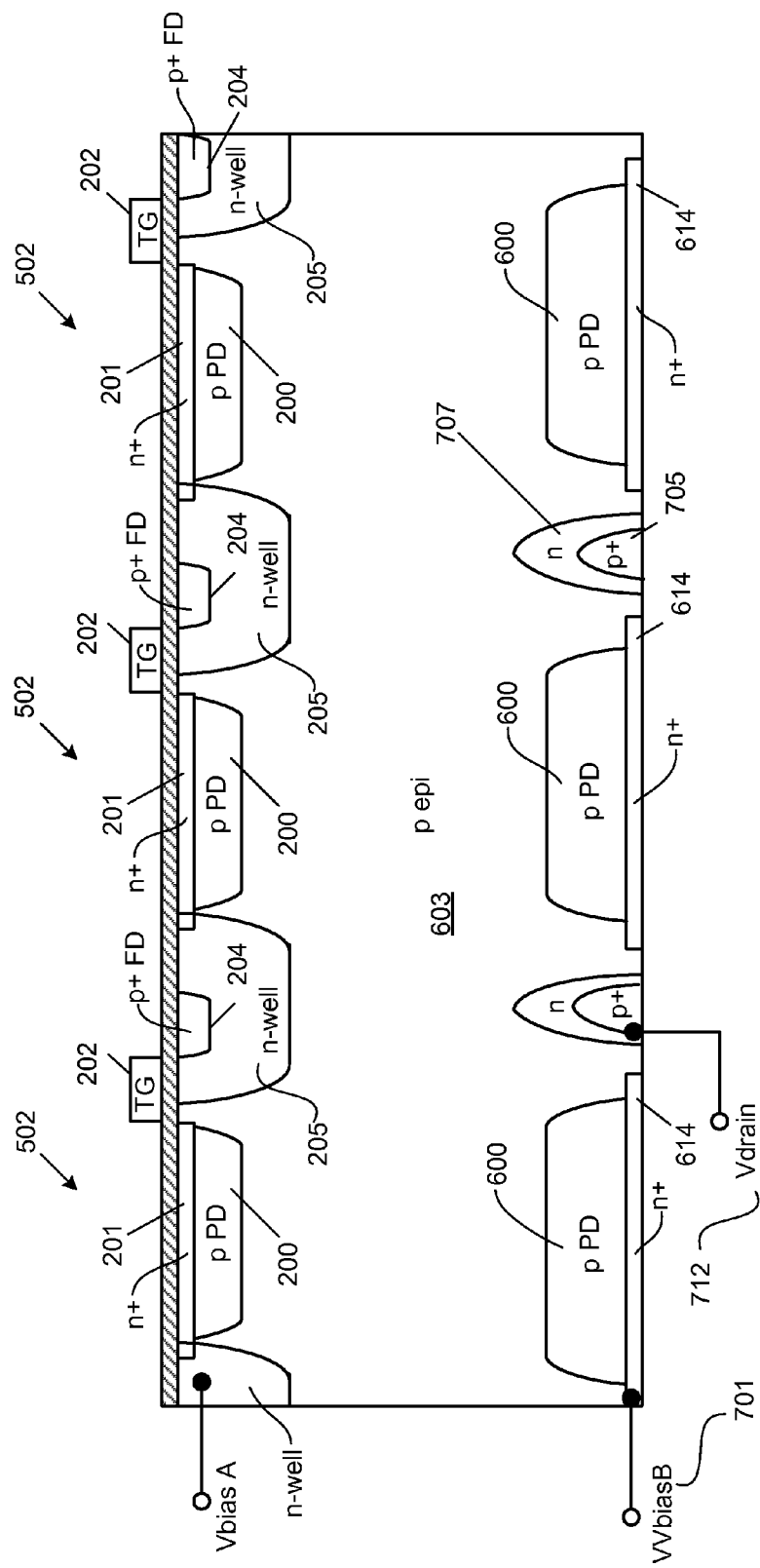
FIG. 23 is a cross-sectional view of a portion of a fifth image sensor in an embodiment in accordance with the invention.
Figure 24:
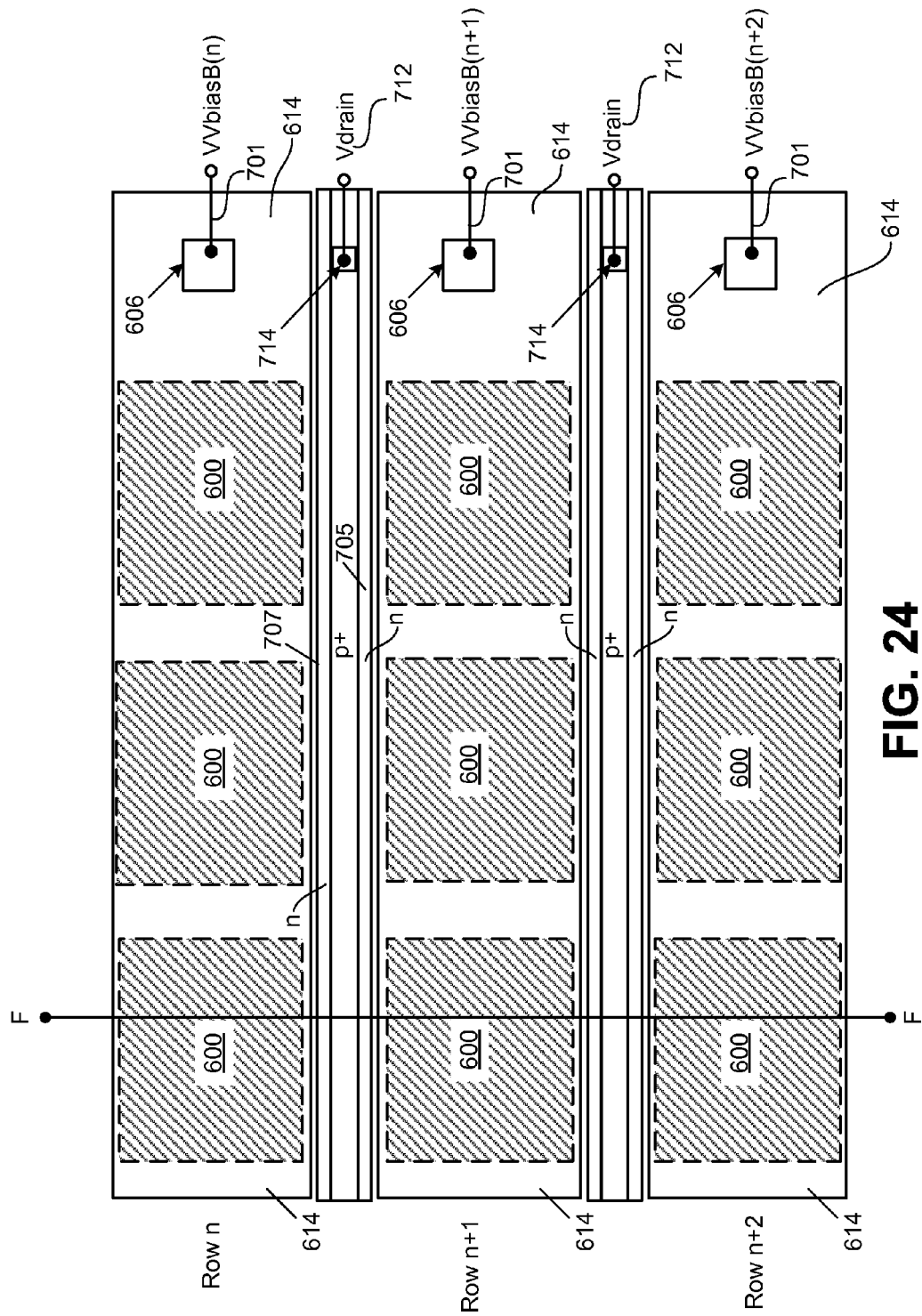
FIG. 24 illustrates a backside plan view of a portion of the image sensor shown in FIG. 23 in an embodiment in accordance with the invention.

Referring to FIGS. 23 and 24, an alternate fifth embodiment of an image sensor with a p+ LOD 705 is shown. The cross-sectional view of FIG. 23 is taken along line F-F shown in FIG. 24. In this configuration, referring to the plan view of FIG. 24, the p+ LOD 705 are long row regions between backside photodetectors 600. For this configuration, the n+ pinning regions 614 are row isolated and the n+ pinning regions 614 can be clocked independently.

Figure 25:
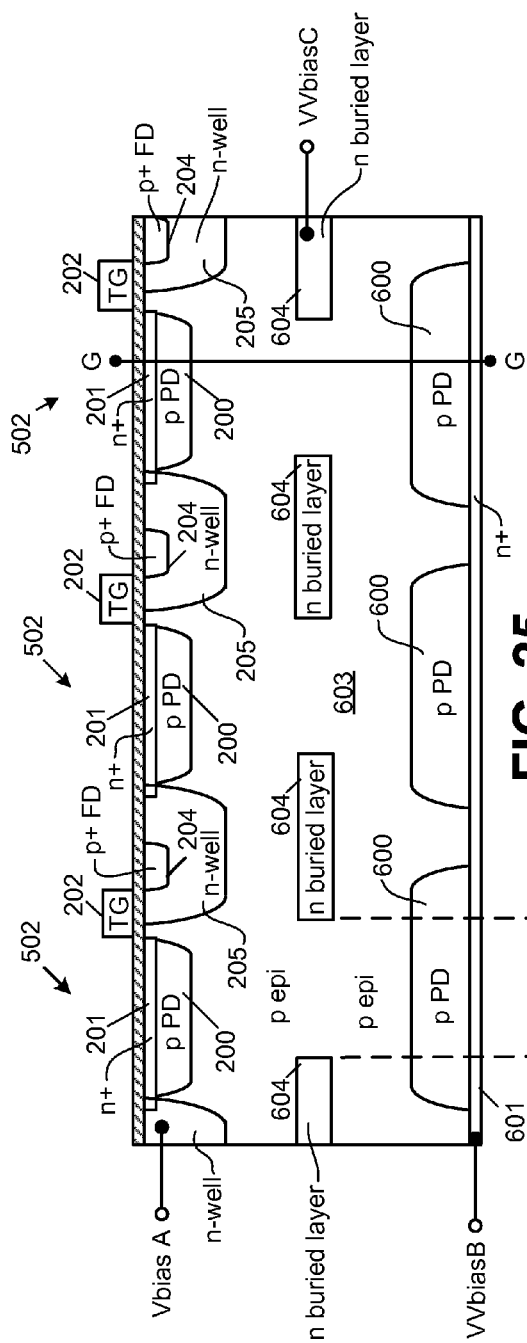
FIG. 25 illustrates a cross-sectional view of a portion of a sixth image sensor in an embodiment in accordance with the invention.
Figure 26:
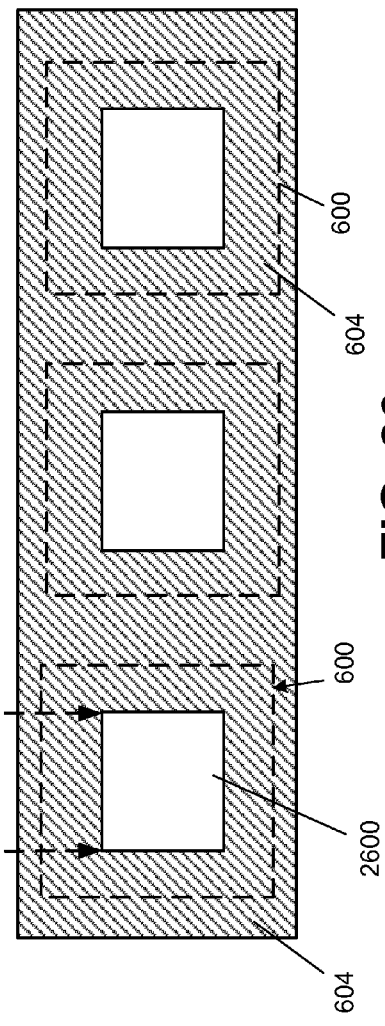
FIG. 26 illustrates a backside plan view of a portion of the image sensor shown in FIG. 25 in an embodiment in accordance with the invention.

A portion of a sixth image sensor is shown in FIGS. 25 and 26 in an embodiment in accordance with the invention. The illustrated embodiment retains all of the elements described and associated with FIGS. 6-9, with the additional structural element of a patterned n-type buried layer 604. Referring to FIG. 26, a backside plan view illustrating three pixels is shown. The backside photodetector 600 and patterned n-type buried layer 604 layout are shown. Although not shown, it should be noted that the backside pinning layer 601 can be configured as isolated regions per row or as a single block for the pixel array as previously described. The dotted area in FIG. 26 is the n-type buried layer 604. The openings 2600 in the n-type buried layer 604 are aligned, or substantially aligned, with the backside photodetectors 600, so there is a continuous p-type region connecting respective backside photodetectors 600 and front-side photodetectors 200. The size, shape and position of the openings 2600 in the n-type buried layer 604 do not have to be precisely aligned in embodiments in accordance with the invention. Instead of square openings, the openings can be circular or slots. Also, different subsets of pixels can have different sized openings in the n-buried layer 604 to provide different operating characteristics to the different subsets.

Control of the middle barrier region 800 is provided by a second adjustable and programmable potential VVbiasC (FIG. 25) that is connected to the patterned n-type buried layer 604. Connection to the buried layer 604 can be made by various methods known in the art.

Figure 27:
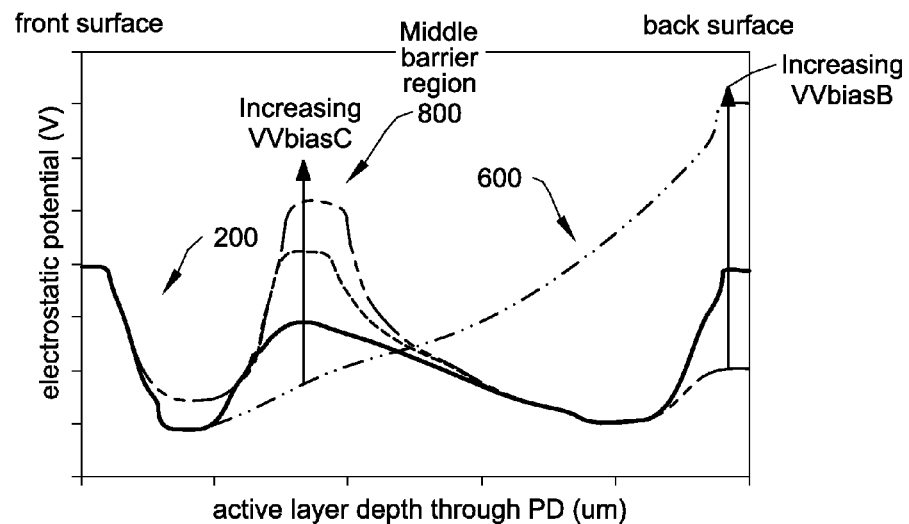
FIG. 27 depicts electrostatic potential profiles along line G-G shown in FIG. 26 in an embodiment in accordance with the invention.

Referring now to FIG. 27, there are shown a series of electrostatic potential profiles along line G-G of FIG. 25. Each of the profiles corresponds to a particular set of potentials applied to VVbiasB and VVbiasC. In all cases, VbiasA is set to V1 in the illustrated embodiment. The solid line in FIG. 27 is the electrostatic profile for a condition where VVbiasB is at V1 and VVbiasC is at an initial voltage Vi. Depending on the design and structural details of the image sensor, Vi may be less than, greater than or equal to V1. When VbiasA=V1, VVbiasB=V1, and VVbiasC=Vi are applied, separate front-side photodetectors 200 and backside photodetector 600 collection regions are formed with a middle barrier region 800 having an electrostatic potential lower than that of the front-side pinning layer 201 and backside pinning layer 601, but greater than that of the front-side and backside photodetector 200, 600 collection regions.

The dashed line in FIG. 27 is the electrostatic profile for a condition where VbiasA is at V1, VVbiasB is at V1, and VVbiasC is at voltage Va, where Va>Vi. With this biasing pattern, the potential of the middle barrier region 800 is increased, producing a larger barrier between the front-side and backside photodetectors. This will increase the charge capacity and improve the blooming characteristics of the backside photodetectors 600.

The dotted line in FIG. 27 is the electrostatic profile for a biasing pattern where VbiasA is at V1, VVbiasB is at V1, and VVbiasC is at voltage Vb where Vb>Va. With this biasing pattern, the potential of the middle barrier region 800 is further increased, producing a yet larger barrier between the front-side and backside photodetectors. This can increase the charge capacity of the front-side and backside photodetectors and improve the blooming characteristics of the backside photodetectors 600.

The dashed-dotted line in FIG. 27 is the electrostatic profile for a biasing pattern where VbiasA is at V1, VVbiasB is at V2, and VVbiasC is at voltage $\leqq$Vi. With this biasing pattern, charge is transferred from the backside photodetector 600 to the front-side photodetector 200, or charge is mixed during the integration phase. Different voltage levels can be applied in a static or temporally variant manner to provide methods of operation that have been described, or associated with methods of operation that have been described.

Figure 28:
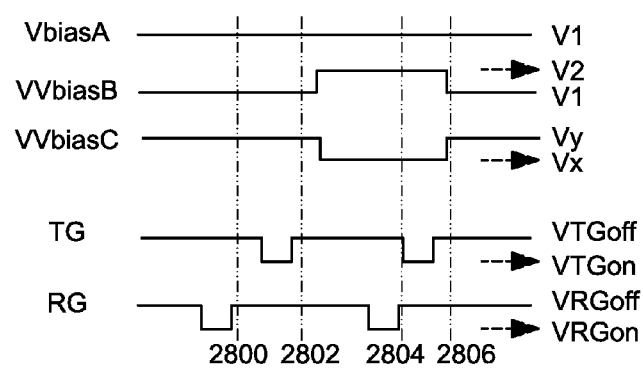
FIG. 28 illustrates one example of a timing diagram for a method of operating the image sensor shown in FIG. 25 in an embodiment in accordance with the invention.

One example of a method of operating the image sensor shown in FIGS. 25 and 26 can use the timing diagram of FIG. 28. This is one exemplary method of integrating one or two separate charge packets, and readout of these charge packets. This is analogous to the timing diagrams in FIGS. 9 and 11, with the added potential bias of VVbiasC. During the integration phase, the voltage on VVbiasC is at a voltage Vx which produces a desired electrostatic potential barrier between the front-side and backside photodetectors. After integration is complete at time 2800, charge is transferred from the front-side photodetector 200 to the charge to voltage conversion region 204. These charge packets may be photo-generated charge for a rolling shutter mode of operation, or may be dark current generated charge when the front-side photodetector 200 is used as a storage node for a global shutter mode of operation. Next, at time 2802, charge is transferred from the backside photodetector 600 to the front-side photodetector 200 by changing the voltage on VVbiasC along with that of VVbiasB to reduce the electrostatic potential in the middle barrier region 800 and increase the electrostatic potential in the backside photodetector 600, respectively. After charge is transferred from the backside photodetectors 600 to the front-side photodetectors 200, both VVbiasB and VVBiasC can optionally remain at Vy and V2 as shown, or VVbiasB and VVBiasC can be returned to Vx and V1, respectively.

At time 2804, charge stored in the front-side photodetectors 200 is transferred to the charge to voltage conversion regions 204 by pulsing the voltage on the transfer gate (TG). At time 2806, the voltages on VVbias B and VVbiasC are returned to V1 and Vx, respectively, to begin integration of charge in a subsequent image capture.

Connecting the n-type patterned buried layer 604 to VVbiasC provides several advantages. First, control of the front-side and backside photodetector doping profiles can be less critical since the voltage on VVbiasC can be adjusted to provide the desired electrostatic profile in accordance with variation in the doping profiles. Second, a higher charge capacity can be achieved in the backside photodetector 600 by providing a larger electrostatic potential barrier between the backside photodetector 600 and front-side photodetector 200. The patterned n-type buried layer 604 is particularly beneficial for global shutter mode operation, where a VGLOD 705 and 706 are disposed on the backside as previously described. By raising the potential of the middle barrier region 800 during integration, it is easier to implement a VGLOD 705 and 706 and retain adequate charge capacity in the backside photodetector 600.

The invention has been described in detail with particular reference to certain embodiments thereof, but it will be understood that variations and modifications can be effected within the spirit and scope of the invention. For example, the substrate, photodetectors, pinning layers, and buried layer can have the opposite conductivity type. The different potentials, including VbiasA, VVbiasB, or VVbias C, can be produced by a timing generator or read from a memory located on the image sensor itself, or the potentials can be produced by a timing generator or read from a memory located external to (not integrated with) the image sensor. Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

| PARTS LIST | |
|---|---|
| 106 | front-side pixel components |
| 200 | front-side p-type photodetector |
| 201 | front-side n-type pinning layer |
| 202 | transfer gate |
| 204 | charge to voltage conversion region |
| 205 | front-side n-well |
| 206 | reset transistor |
| 208 | reset gate |
| 212 | amplifier transistor |
| 214 | pixel supply voltage |
| 216 | output line |
| 400 | image capture device |
| 402 | light |
| 404 | imaging stage |
| 406 | image sensor |
| 408 | processor |
| 410 | memory |

-continued

PARTS LIST

| | |
|---|---|
| 412 | display |
| 414 | other I/O |
| 500 | image sensor |
| 501 | pixel |
| 502 | pixel |
| 503 | pixel |
| 504 | pixel array |
| 505 | CMOS circuit region |
| 506 | column decoder and sample and hold circuits |
| 508 | row decoders and drivers |
| 510 | digital logic circuits |
| 512 | analog or digital output circuits |
| 600 | backside p-type photodetectors |
| 601 | backside n-type pinning layer |
| 602 | backside n-type isolation region |
| 603 | p-type substrate or p-type epitaxial layer |
| 604 | n-type buried layer |
| 606 | backside contact |
| 610 | backside n-type pinning layer |
| 612 | backside n-type pinning layer |
| 614 | backside n-type pinning layer |
| 701 | backside pinning layer bias |
| 705 | backside lateral overflow drain region |
| 706 | backside lateral overflow barrier region |
| 707 | backside lateral overflow barrier region |
| 708 | backside conductor layer |
| 709 | backside lateral overflow drain contacts |
| 712 | backside lateral overflow drain bias |
| 714 | backside lateral overflow drain peripheral contacts |
| 718f | front-side photodetector |
| 720f | front-side photodetector |
| 722f | front-side photodetector |
| 718b | backside photodetector |
| 720b | backside photodetector |
| 722b | backside photodetector |
| 732 | contact |
| 800 | middle barrier region |
| 1100 | front-side surface |
| 1104 | contact |
| 1112 | backside surface |
| 1200 | electrostatic potential |
| 2600 | openings in n-type buried layer |

What is claimed is:

1. A method for reading charge out of a pixel in an image sensor comprising a plurality of pixels, wherein the pixel includes a front-side photodetector of a first conductivity type disposed in a substrate layer of the first conductivity type adjacent to a front-side of the substrate layer, a backside photodetector of the first conductivity type disposed in the substrate layer adjacent to a backside of the substrate layer, a front-side pinning layer of a second conductivity type spanning the front-side photodetector, a backside pinning layer of the second conductivity type spanning the backside photodetector, a front-side charge to voltage conversion region of the first conductivity type disposed in a front-side well of the second conductivity adjacent to the front-side photodetector, and a buried layer of the second conductivity type disposed in the substrate layer between the front-side and backside photodetectors, wherein the buried layer is patterned with a gap in the buried layer that is aligned with the front-side and backside photodetectors such that a continuous region of the substrate layer extends from the front-side photodetector through the gap to the backside photodetector, the method comprising:

setting the front-side pinning layer to a first potential;

producing an electrostatic barrier between the front-side photodetector and the backside photodetector by adjusting an adjustable and programmable second potential on the backside pinning layer to a second potential and adjusting an adjustable and programmable third potential on the buried layer to a third potential;

capturing an image by collecting photogenerated charge in the front-side photodetector and in the backside photodetector;

transferring the charge from the front-side photodetector to the charge to voltage conversion region;

removing the electrostatic barrier between the backside photodetector and the front-side photodetector and transferring the charge from the backside photodetector to the front-side photodetector by adjusting the adjustable and programmable second and third potentials to different potentials; and transferring the charge from the front-side photodetector to the charge to voltage conversion region.

2. The method as in claim 1, wherein the pixel further includes a transfer gate between the front-side photodetector and the front-side charge to voltage conversion region.

3. The method as in claim 1, wherein transferring the charge from front-side photodetector to the charge to voltage conversion region comprises pulsing a signal applied to the transfer gate to transfer the charge from front-side photodetector to the charge to voltage conversion region.

4. The method as in claim 1, further comprising resetting the charge to voltage conversion region to a known potential prior to collecting photogenerated charge in the front-side and backside photodetectors and prior to transferring the charge from the front-side photodetector to the charge to voltage conversion region.

5. The method as in claim 1, wherein the first conductivity type is a p conductivity type and the second conductivity type is an n conductivity type.

* * * * *